US012568657B2

(12) United States Patent
    Woo

(10) Patent No.: US 12,568,657 B2
(45) Date of Patent: Mar. 3, 2026

(54) INTEGRATED CIRCUIT DEVICE

(71) Applicant: SAMSUNG ELECTRONICS CO., LTD., Suwon-si (KR)

(72) Inventor: Jongsung Woo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 348 days.

(21) Appl. No.: 18/204,508

(22) Filed: Jun. 1, 2023

(65) Prior Publication Data

US 2024/0113185 A1     Apr. 4, 2024

(30) Foreign Application Priority Data

Sep. 29, 2022   (KR) ........................ 10-2022-0124648

(51) Int. Cl.
    H10D 30/68     (2025.01)
    H10B 41/35     (2023.01)
(52) U.S. Cl.
    CPC ......... H10D 30/6892 (2025.01); H10B 41/35 (2023.02); H10D 30/68 (2025.01)
(58) Field of Classification Search
    CPC .............. H10D 30/6892; H10D 30/68; H10D 30/6891; H10B 41/35; H10B 41/30; H10B 41/42
    USPC ....................................................... 257/314
    See application file for complete search history.

(56) References Cited

U.S. PATENT DOCUMENTS 9,922,986 B2    3/2018   Richter et al.
9,972,634 B2    5/2018   Richter et al.
2005/0139894 A1*   6/2005   Choi ....................... H10B 69/00
                                                            257/314
2007/0007582 A1*   1/2007   Hatakeyama ........ H10D 64/035
                                                            257/E21.209
2007/0063254 A1*   3/2007   Kim ......................... H10B 69/00
                                                            257/315
2007/0200165 A1*   8/2007   Jeong ..................... H10B 69/00
                                                            257/315
2012/0081958 A1*   4/2012   Lee ......................... H01L 23/50
                                                            365/185.05
2013/0256761 A1*   10/2013   Sim ........................ H10B 41/35
                                                            257/208

(Continued)

FOREIGN PATENT DOCUMENTS

CN      115568221 A     1/2023
TW      202303939 A     1/2023

*Primary Examiner* — Sheikh Maruf
(74) *Attorney, Agent, or Firm* — Muir Patent Law, PLLC

(57)     ABSTRACT

An integrated circuit (IC) device includes a floating gate line and a control gate line on a substrate, an insulating spacer covering a sidewall of each of the floating gate line and the control gate line, and a selection gate structure apart from the floating gate line and the control gate line with the insulating spacer therebetween, the selection gate structure having a first sidewall on the control gate line and a second sidewall closer to the substrate than is the first sidewall, wherein the selection gate structure includes a selection gate line and a lower metal nitride film between the substrate and a bottom surface of the selection gate line and between a sidewall of the selection gate line and the insulating spacer, the lower metal nitride film having a first uppermost surface that is closer to the substrate than is an uppermost surface of the insulating spacer.

20 Claims, 29 Drawing Sheets

(56)          References Cited

U.S. PATENT DOCUMENTS

| | | | |
|---|---|---|---|
| 2014/0306280 A1* | 10/2014 | Lee ..................... | H10D 30/681 |
| | | | 438/587 |
| 2015/0364481 A1* | 12/2015 | Mizushima .......... | H10D 64/035 |
| | | | 257/316 |
| 2015/0371996 A1* | 12/2015 | Shin ..................... | H01L 21/764 |
| | | | 365/185.17 |
| 2016/0293618 A1* | 10/2016 | Namkoong ........ | H10D 30/6891 |
| 2017/0243946 A1* | 8/2017 | Pan ................... | H10D 30/6892 |
| 2019/0013314 A1* | 1/2019 | Choi ................... | H01L 23/5283 |
| 2020/0395369 A1* | 12/2020 | Yi .......................... | H10D 30/68 |
| 2023/0005939 A1 | 1/2023 | Woo et al. | |

\* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2022-0124648, filed on Sep. 29, 2022, in the Korean Intellectual Property Office, the disclosure of which is incorporated by reference herein in its entirety.

BACKGROUND

1. Field

Embodiments relate to an integrated circuit (IC) device, and more particularly, to an IC device including a split-gate-type transistor.

2. Description of the Related Art

Due to the development of electronic technology, the downscaling of IC devices has rapidly progressed. Accordingly, research has been conducted into a logic embedded flash memory device including both a flash memory device and a logic device in one chip.

SUMMARY

Embodiments are directed to an integrated circuit device including a floating gate line and a control gate line overlapping each other in a vertical direction on a substrate, an insulating spacer covering a sidewall of each of the floating gate line and the control gate line, and a selection gate structure apart from the floating gate line and the control gate line in a first lateral direction with the insulating spacer therebetween, the selection gate structure having a first sidewall and a second sidewall, the first sidewall vertically overlapping the control gate line above the control gate line, the second sidewall being apart from the insulating spacer in the first lateral direction, the second sidewall being closer to the substrate than the first sidewall, wherein the selection gate structure includes a selection gate line apart from the insulating spacer, the selection gate line continuously extending from the first sidewall to the second sidewall, and a lower metal nitride film between the substrate and a bottom surface of the selection gate line and between a sidewall of the selection gate line and the insulating spacer, the lower metal nitride film having a first uppermost surface closer to the substrate than an uppermost surface of the insulating spacer.

Embodiments may further provide an integrated circuit device including a substrate comprising a memory region and a logic region, a memory transistor on the substrate in the memory region, the memory transistor including a floating gate line and a control gate line, the floating gate line and the control gate line overlapping each other in a vertical direction, an insulating spacer covering a sidewall of each of the floating gate line and the control gate line, in the memory region, a selection gate structure apart from the memory transistor in a first lateral direction with the insulating spacer therebetween in the memory region, the selection gate structure having a first sidewall and a second sidewall, the first sidewall vertically overlapping the memory transistor above the memory transistor, the second sidewall being apart from the insulating spacer in the first lateral direction, the second sidewall being closer to the substrate than is the first sidewall; and a logic transistor on the substrate in the logic region, wherein the selection gate structure includes a selection gate line apart from the insulating spacer, the selection gate line continuously extending from the first sidewall of the selection gate structure to the second sidewall of the selection gate structure, a first lower work-function control film between the substrate and a bottom surface of the selection gate line and between a sidewall of the selection gate line and the insulating spacer, the first lower work-function control film having a first uppermost surface that is closer to the substrate than is an uppermost surface of the insulating spacer, and wherein the logic transistor includes a gate, and a second work-function control film between the substrate and the gate, wherein the first lower work-function control film and the second work-function control film include the same metal nitride as each other.

According to embodiments, there is provided an IC device including a memory transistor including a floating gate line and a control gate line, the floating gate line and the control gate overlapping each other in a vertical direction on a substrate, an insulating spacer covering a sidewall of each of the floating gate line and the control gate line, and a selection gate structure apart from the floating gate line and the control gate line in a first lateral direction with the insulating spacer therebetween, the selection gate structure having a first sidewall and a second sidewall, the first sidewall vertically overlapping the control gate line above the control gate line, the second sidewall being apart from the insulating spacer in the first lateral direction, the second sidewall being closer to the substrate than is the first sidewall, wherein the selection gate structure includes an interface insulating film, a high-k dielectric film, a work-function control metal film, a lower work-function control metal nitride film, and a selection gate line, which are sequentially stacked on the substrate, each of the high-k dielectric film, the work-function control metal film, and the selection gate line continuously extends from the first sidewall of the selection gate structure to the second sidewall of the selection gate structure, the lower work-function control metal nitride film includes a first portion and a second portion, the first portion being between the work-function control metal film and a bottom surface of the selection gate line at a position apart from the insulating spacer in the first lateral direction and, the second portion being between the work-function control metal film and the sidewall of the selection gate line at a position closer to the insulating spacer than the first portion, wherein a first uppermost surface of the lower work-function control metal nitride film is closer to the substrate than is an uppermost surface of the insulating spacer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
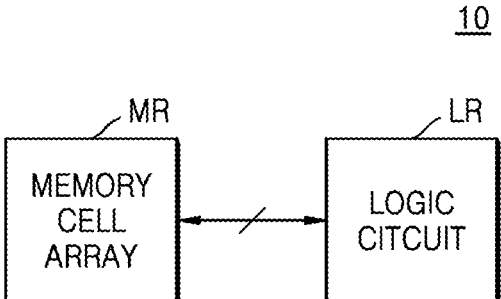
FIG. 1 is a block diagram of an integrated circuit (IC) device according to embodiments.

Hereinafter, embodiments will be described in detail with reference to the accompanying drawings. The same reference numerals are used to denote the same elements in the drawings, and repeated descriptions thereof are omitted.

FIG. 1 is a block diagram of an integrated circuit (IC) device 10 according to embodiments.

Referring to FIG. 1, the IC device 10 may include a memory region MR and a logic region LR. The memory region MR may include a plurality of memory blocks including a memory cell array. The logic region LR may include a plurality of logic circuits. The plurality of logic circuits may control operations of erasing data stored in the memory cell array included in the memory region MR, writing new data, or reading the stored data.

The memory region MR and the logic region LR may be different regions on one substrate. The IC device 10 may be a logic embedded flash memory device including a slit-type non-volatile memory device in the memory region MR and logic circuits in the logic region LR.

Figure 2A:
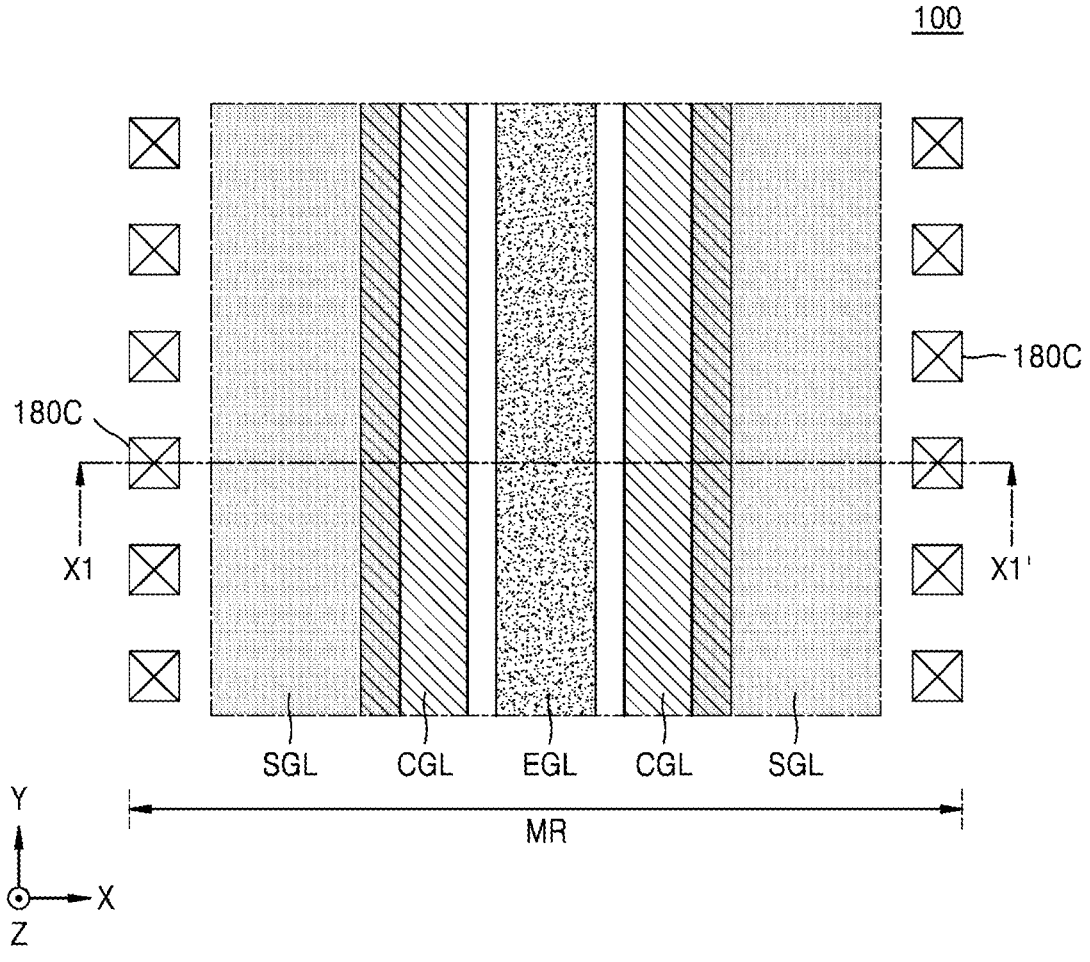
FIG. 2A is a plan layout diagram of some components in a memory region of an IC device according to embodiments.
Figure 2B:
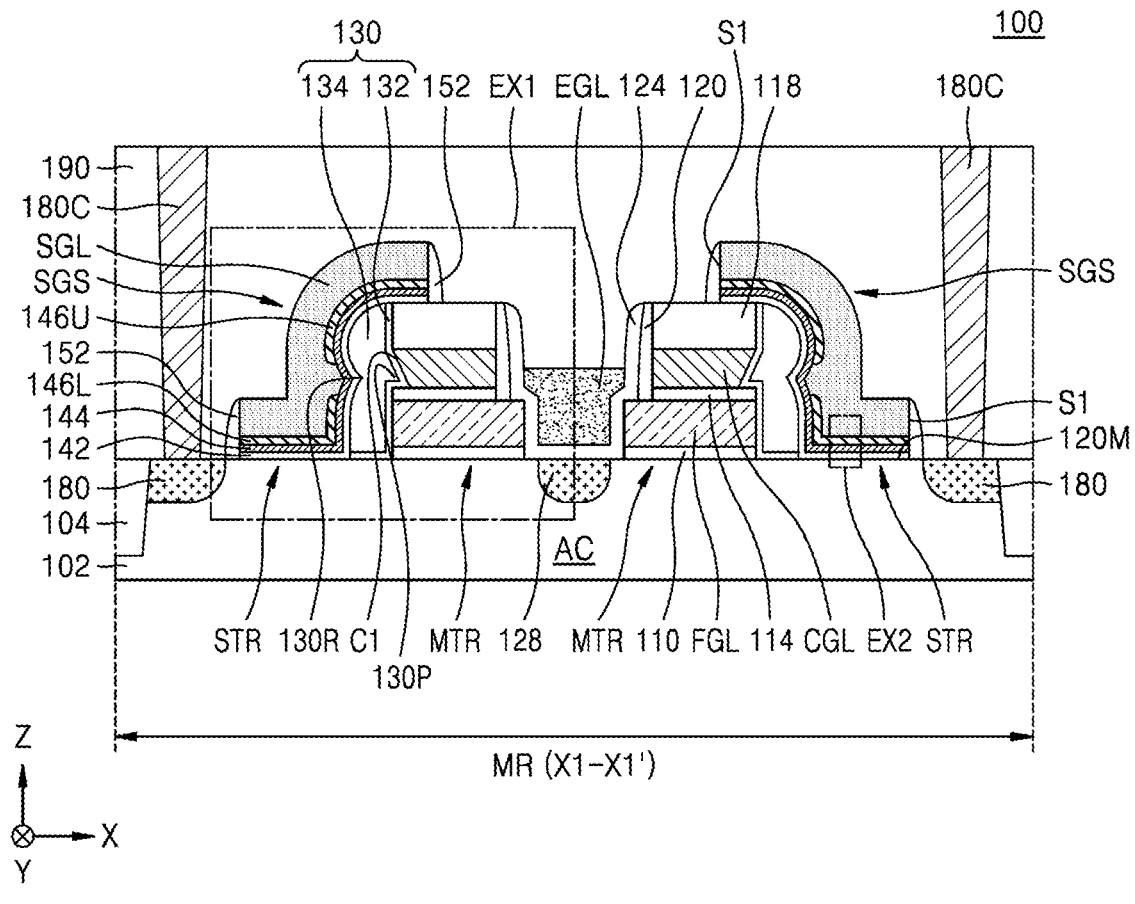
FIG. 2B is a cross-sectional view taken along line X1-X1' of FIG. 2A.
Figure 2C:
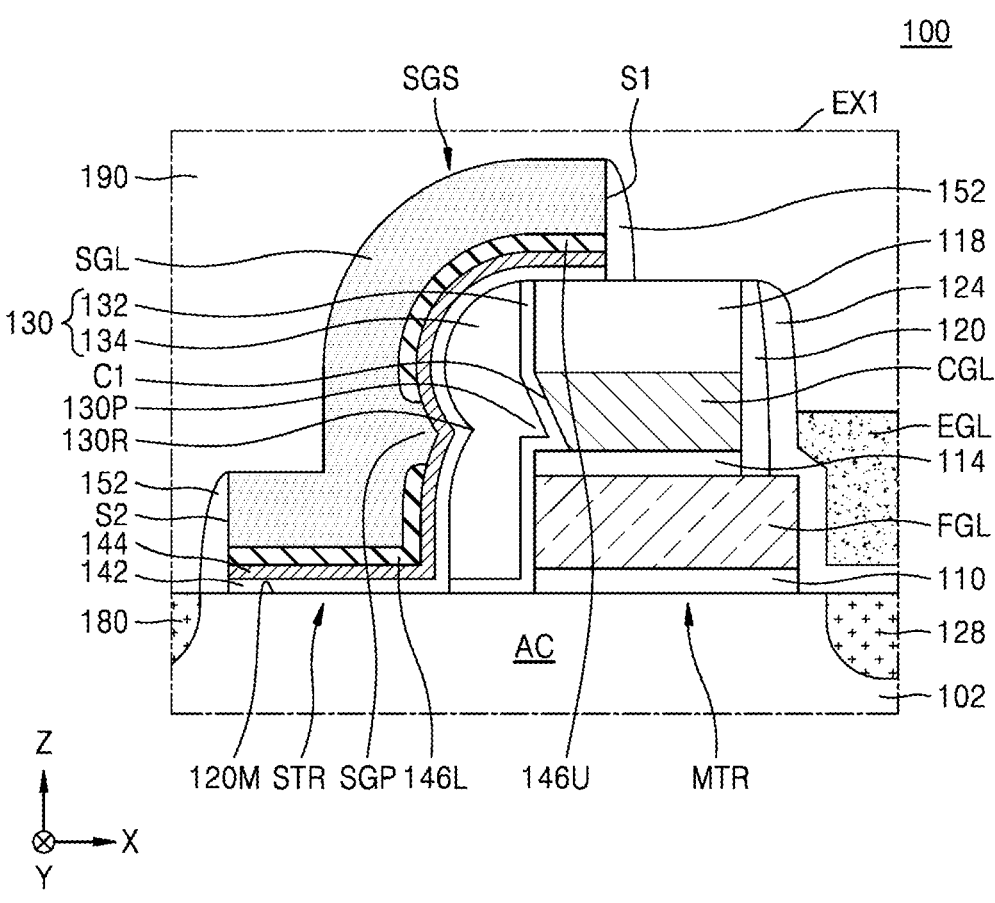
FIG. 2C is an enlarged cross-sectional view of portion "EX1" of FIG. 2B.
Figure 3:
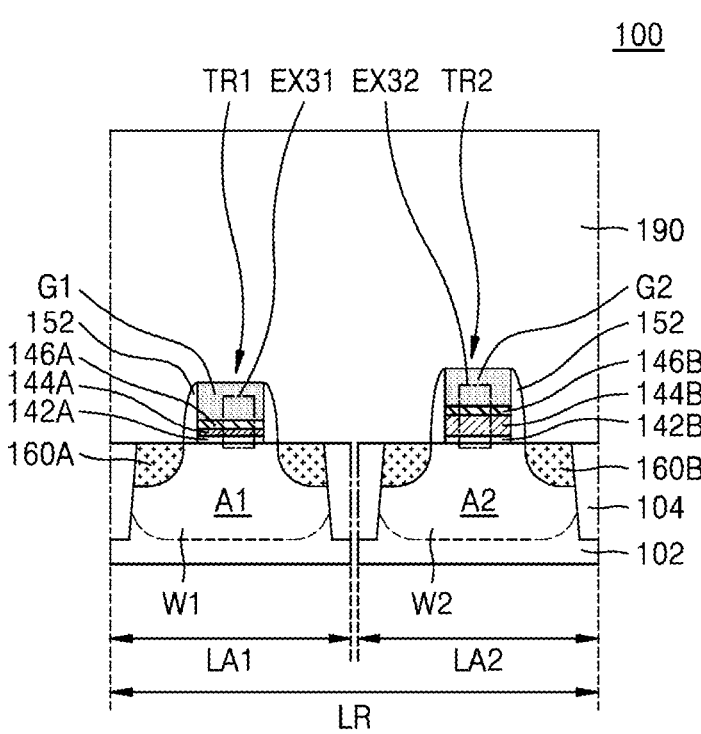
FIG. 3 is a cross-sectional view of some components of a logic region of an IC device according to embodiments.

FIG. 2A is a plan layout diagram of some components of a memory region MR of an IC device 100 according to embodiments. FIG. 2B is a cross-sectional view taken along line X1-X1' of FIG. 2A. FIG. 2C is an enlarged cross-sectional view of portion "EX1" of FIG. 2B; FIG. 3 is a cross-sectional view of some components of a logic region LR of the IC device 100 shown in FIG. 2.

Referring to FIGS. 2A to 2C and 3, the IC device 100 may include a substrate 102 including the memory region MR and the logic region LR, which have been described with reference to FIG. 1.

The substrate 102 may have a main surface 110M that extends in a lateral direction (X-Y plane direction). As shown in FIGS. 2B and 2C, in the memory region MR, an active region AC may be defined by a device isolation film 104 in the substrate 102. As shown in FIG. 3, in the logic region LR, a first active region A1 may be defined in a first region LA1 of the substrate 102, and a second active region A2 may be defined in a second region LA2 of the substrate 102.

The substrate 102 may include a semiconductor (e.g., silicon (Si) or germanium (Ge)) or a compound semiconductor (e.g., silicon germanium (SiGe), silicon carbide (SiC), gallium arsenide (GaAs), indium arsenide (InAs), indium gallium arsenide (InGaAs), or indium phosphide (InP)). As used herein each of the terms "SiGe," "SiC," "GaAs," "InAs," "InGaAs," and "InP" refers to a material including elements included therein, without referring to a chemical formula representing a stoichiometric relationship. The substrate 102 may include a conductive region, for example, a doped well or a doped structure.

As shown in FIGS. 2A to 2C, the IC device 100 may include a pair of memory transistors MTR on the substrate 102 in the memory region MR, a pair of selection gate structures SGS respectively one-by-one on both sides of the pair of memory transistors MTR, and an erase gate line EGL between the pair of memory transistors MTR.

The pair of memory transistors MTR may each include a floating gate line FGL and a control gate line CGL, which overlap each other in a vertical direction (Z direction).

A first tunnel insulating film 110 may be between the substrate 102 and the floating gate line FGL, and a dielectric film 114 may be between the floating gate line FGL and the control gate line CGL. A top surface of the control gate line CGL may be covered by a capping layer 118.

The first tunnel insulating film 110 may include a silicon oxide film, as a non-limiting example. In embodiments, the first tunnel insulating film 110 may be obtained by thermally oxidizing a surface of the substrate 102. The dielectric film 114 may include a silicon oxide film, a silicon nitride film, or a combination thereof. In embodiments, the dielectric film 114 may have a multilayered structure including a first silicon oxide film, a silicon nitride film, and a second silicon oxide film, which are sequentially stacked on a top surface of the floating gate line FGL. The capping layer 118 may include a silicon nitride film, a silicon oxide film, or a combination thereof. For example, the capping layer 118 may include a silicon nitride film.

One sidewall of each of the first tunnel insulating film 110, the floating gate line FGL, the dielectric film 114, the control gate line CGL, and the capping layer 118 may be covered by an insulating spacer 130. The insulating spacer 130 may include a double layer including a silicon oxide film 132 and a silicon nitride film 134 as non-limiting examples. The silicon oxide film 132 may be in contact with one sidewall of each of the floating gate line FGL and the control gate line CGL, and the silicon nitride film 134 may cover one sidewall of each of the floating gate line FGL and the control gate line CGL on the silicon oxide film 132.

Another sidewall of each of the dielectric film 114, the control gate line CGL, and the capping layer 118 may be covered by an insulating spacer 120. A bottom surface of the insulating spacer 120 may be in contact with the top surface of the floating gate line FGL. The insulating spacer 120 may include a silicon oxide film, a silicon nitride film, or a combination thereof.

A second tunnel insulating film 124 may be between the substrate 102 and the erase gate line EGL. The second tunnel insulating film 124 may include portions, which extend in the vertical direction (Z direction) between the floating gate line FGL and the erase gate line EGL and between the control gate line CGL and the erase gate line EGL. The second tunnel insulating film 124 may be in contact with a bottom surface and the sidewall of the erase gate line EGL and the sidewall of the floating gate line FGL. The second tunnel insulating film 124 may be apart from the control gate line CGL and the capping layer 118 in a first lateral direction (X direction) with the insulating spacer 120 therebetween. The second tunnel insulating film 124 may include a silicon oxide film, as a non-limiting example.

Each of the floating gate line FGL, the control gate line CGL, and the erase gate line EGL may extend long in a second lateral direction (Y direction). Each of the floating gate line FGL, the control gate line CGL, and the erase gate line EGL may include doped polysilicon, a metal, a conductive metal nitride, or a combination thereof. For example, each of the floating gate line FGL, the control gate line CGL, and the erase gate line EGL may include doped polysilicon.

The pair of selection gate structures SGS may be apart from the memory transistor MTR in the first lateral direction (X direction) with an insulating spacer 130 therebetween. Each of the pair of selection gate structures SGS may have a first sidewall S1 and a second sidewall S2. The first sidewall S1 may vertically overlap the memory transistor MTR above the memory transistor MTR. The second sidewall S2 may be apart from the insulating spacer 130 in the first lateral direction (X direction) and closer to the substrate 102 than is the first sidewall S1.

As shown in FIGS. 2B and 2C, the selection gate structure SGS may include a selection gate dielectric film 142, a work-function control metal film 144, a lower work-function control metal nitride film 146L, an upper work-function control metal nitride film 146U, and a selection gate line SGL, which are sequentially stacked on the main surface 110M of the substrate 102. As used herein, the work-function control metal film 144, the lower work-function control metal nitride film 146L, and the upper work-function control metal nitride film 146U may be referred to as a work-function control film, a lower work-function control film, and an upper work-function control film, respectively. In addition, as used herein, the lower work-function control metal nitride film 146L and the upper work-function control metal nitride film 146U may be referred to as a lower metal nitride film and an upper metal nitride film, respectively.

The selection gate line SGL may extend long in the second lateral direction (Y direction). The selection gate line SGL may be apart from the insulating spacer 130 in the first lateral direction (X direction). In a cross-sectional view (e.g., X-Z cross-section), the selection gate line SGL may continuously extend from the first sidewall S1 of the selection gate structure SGS to the second sidewall S2 thereof. The selection gate line SGL may include doped polysilicon, a metal, a conductive metal nitride, or a combination thereof. For example, the selection gate line SGL may include doped polysilicon.

Figure 5:
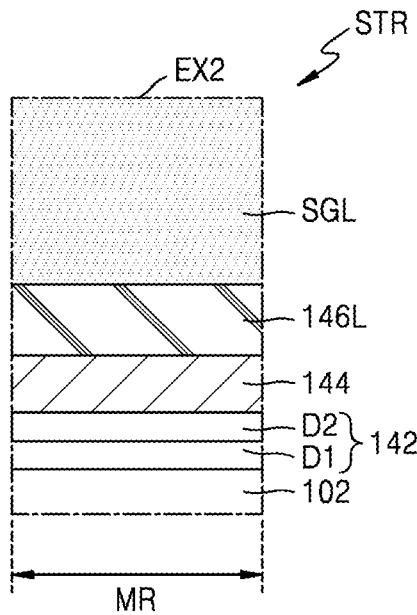
FIG. 5 is an enlarged cross-sectional view of an example configuration of portion "EX2" of FIG. 2B.

FIG. 5 is an enlarged cross-sectional view of an example configuration of portion "EX2" of FIG. 2B.

Referring to FIG. 5, the selection gate dielectric film 142 may have a stack structure of an interface dielectric film D1 and a high-k dielectric film D2. The interface dielectric film D1 may include a low-k dielectric material film having a dielectric constant of about 9 or less, for example, a silicon oxide film, a silicon oxynitride film, or a combination thereof. In embodiments, the interface dielectric film D1 may include a silicon oxide film obtained by thermally oxidizing a surface of a substrate 102. In the memory region MR, a bottom surface of the interface dielectric film D1 may be in contact with an active region AC of the substrate 102. The high-k dielectric film D2 may be between the interface dielectric film D1 and a work-function control metal film 144. The high-k dielectric film D2 may include a material having a higher dielectric constant than a silicon oxide film. For example, the high-k dielectric film D2 may have a dielectric constant of about 10 to about 25. The high-k dielectric film may include hafnium oxide, without being limited thereto.

The work-function control metal film 144 may include lanthanum (La), aluminum (Al), or a combination thereof. For example, the work-function control metal film 144 may include lanthanum. FIGS. 2B and 2C illustrate an example in which the work-function control metal film 144 is between the selection gate dielectric film 142 and a lower work-function control metal nitride film 146L and between the selection gate dielectric film 142 and the upper work-function control metal nitride film 146U. For example, the work-function control metal film 144 may be between a selection gate line SGL and the lower work-function control metal nitride film 146L and between the selection gate line SGL and the upper work-function control metal nitride film 146U. In other embodiments, the work-function control metal film 144 may be omitted.

Referring to FIGS. 2B and 2C again, the lower work-function control metal nitride film 146L and the upper work-function control metal nitride film 146U may be apart from each other in a vertical direction (Z direction). The selection gate line SGL may include a gate protrusion SGP between the lower work-function control metal nitride film 146L and the upper work-function control metal nitride film 146U. The gate protrusion SGP of the selection gate line SGL may pass between the lower work-function control metal nitride film 146L and the upper work-function control metal nitride film 146U in a first lateral direction (X direction) and protrude toward the selection gate dielectric film 142. The gate protrusion SGP of the selection gate line SGL may be between an uppermost surface of the lower work-function control metal nitride film 146L and a lowermost surface of the upper work-function control metal nitride film 146U.

The lower work-function control metal nitride film 146L and the upper work-function control metal nitride film 146U may include the same material as each other. For example, each of the lower work-function control metal nitride film 146L and the upper work-function control metal nitride film 146U may include titanium nitride (TiN), tantalum nitride (TaN), or a combination thereof. For example, each of the lower work-function control metal nitride film 146L and the upper work-function control metal nitride film 146U may include TiN.

The lower work-function control metal nitride film 146L may include a first portion between the substrate 102 and a bottom surface of the selection gate line SGL and a second portion between a sidewall of the selection gate line SGL and the insulating spacer 130 at a position closer to the inner spacer than the first portion. The first portion of the lower work-function control metal nitride film 146L may be apart from the insulating spacer 130 in the first lateral direction (X direction) and be between the work-function control metal film 144 and a bottom surface of the selection gate line SGL. The second portion of the lower work-function control metal nitride film 146L may be between the work-function control metal film 144 and the sidewall of the selection gate line SGL at a position closer to the insulating spacer 130 than the first portion. The uppermost surface of the lower work-function control metal nitride film 146L may be closer to the substrate 102 than is an uppermost surface of the insulating spacer 130. As used herein, the uppermost surface of the lower work-function control metal nitride film 146L may be referred to as a first uppermost surface. As used herein, an uppermost surface of a component refers to a surface of the component that is farthest from a main surface of the substrate 102 in the vertical direction (Z direction).

As shown in FIGS. 2B and 2C, the sidewall of the control gate line CGL, which faces the insulating spacer 130, may include an inclined surface C1 that is inclined such that a width of the control gate line CGL in the first lateral direction (X direction) is reduced toward the substrate 102. The insulating spacer 130 may include a protrusion 130P and a recess 130R. The protrusion 130P may face the inclined surface C1 on a sidewall of the insulating spacer 130 at a vertical level between a top surface of the floating gate line FGL and a top surface of the control gate line CGL. The recess 130R may face the selection gate line SGL on a sidewall of the insulating spacer 130 that is opposite to the protrusion 130P. As used herein, the term "vertical level" refers to a distance from the main surface 102M of the substrate 102 in the vertical direction (Z direction or −Z direction). The protrusion 130P of the insulating spacer 130 may be convex toward the control gate line CGL, and the recess 130R may be concave toward the selection gate line SGL. The first uppermost surface of the lower work-function control metal nitride film 146L may be at the same vertical level as or at a lower vertical level than the recess 130R included in the insulating spacer 130.

The upper work-function control metal nitride film 146U may include a portion between the selection gate line SGL and the insulating spacer 130 at a higher vertical level than the recess 130R of the insulating spacer 130.

Each of the selection gate dielectric film 142 and the work-function control metal film 144 may include a portion between the lower work-function control metal nitride film 146L and the substrate 102, a portion between the selection gate line SGL and the insulating spacer 130, and a portion between the upper work-function control metal nitride film 146U and the insulating spacer 130. Each of the selection gate dielectric film 142 and the work-function control metal film 144 may extend continuously from a side sidewall S1 of the selection gate structure SGS to a second sidewall S2 thereof. The gate protrusion SGP of the selection gate line SGL may be in contact with the work-function control metal film 144 at a vertical level between the lower work-function control metal nitride film 146L and the upper work-function control metal nitride film 146U. The gate protrusion SGP of the selection gate line SGL may cover the uppermost surface of the lower work-function control metal nitride film 146L. The recess 130R of the insulating spacer 130 may face the gate protrusion SGP and be concave toward the selection gate line SGL.

A top surface of the dielectric film 114 between the floating gate line FGL and the control gate line CGL may include a portion in contact with a bottom surface of the control gate line CGL and a portion in contact with the insulating spacer 130. A portion of the top surface of the dielectric film 114 that is in contact with the insulating spacer 130 may protrude more toward the selection gate line SGL than toward the bottom surface of the control gate line CGL in the first lateral direction (X direction).

Each of the first sidewall S1 and the second sidewall S2 of the selection gate structure SGS may be covered by an insulating spacer 152. A bottom surface of a portion of the insulating spacer 152 that covers the first sidewall S1 may be in contact with the main surface 120M of the substrate 102. A bottom surface of a portion of the insulating spacer 152 that covers the second sidewall S2 may be in contact with a top surface of the capping layer 118. The insulating spacer 152 may include a silicon oxide film, a silicon nitride film, or a combination thereof.

The erase gate line EGL may be spaced apart from the selection gate line SGL in the first lateral direction (X direction) with the floating gate line FGL and the control gate line CGL therebetween.

In the substrate 102, a first impurity region 128 may overlap the erase gate line ESL in the vertical direction (Z direction). A second impurity region 180 may be adjacent to the first sidewall S1 of the selection gate structure SGS. The first impurity region 128 may function as a source line, and the second impurity region 180 may function as a bit line. The first impurity region 128 and the second impurity region 180 may extend long in a second lateral direction (Y direction) to extend parallel with the floating gate line FGL, the control gate line CGL, and the erase gate line EGL.

As shown in FIG. 3, a plurality of logic transistors may be in the logic region LR of the IC device 100. The plurality of logic transistors may include a first logic transistor TR in a first region LA1 of the logic region LR and a second logic transistor TR2 in a second region LA2 of the logic region LR.

The first logic transistor TR1 and the second logic transistor TR2 may have different types of channels. In embodiments, the first logic transistor TR1 may include an NMOS transistor, and the second logic transistor TR2 may include a PMOS transistor. A first well W1 may be in the first active region A1 in the first region LA1 of the logic region LR, and a second well W2 may be in the second active region A2 in the second region LA2 of the logic region LR. The first well W1 may include a P-type impurity region, and the second well W2 may include an N-type impurity region.

The first logic transistor TR1 may include a first gate G1 on the substrate 102, a first gate dielectric film 142A, a first work-function control metal film 144A, and a first work-function control metal nitride film 146A, which are sequentially stacked between the first active region A1 of the substrate 102 and the first gate G1, and a pair of first source/drain regions 160A, which are one on each side of the first gate G1 inside the first well W1 in the first active region A1. A sidewall of each of the first gate dielectric film 142A, the first work-function control metal film 144A, the first work-function control metal nitride film 146A, and the first gate G1 may be covered by the insulating spacer 152.

In embodiments, the first gate dielectric film 142A may include the same material as a portion of the selection gate dielectric film 142 included in the selection gate structure SGS in the memory region MR.

Figure 6:
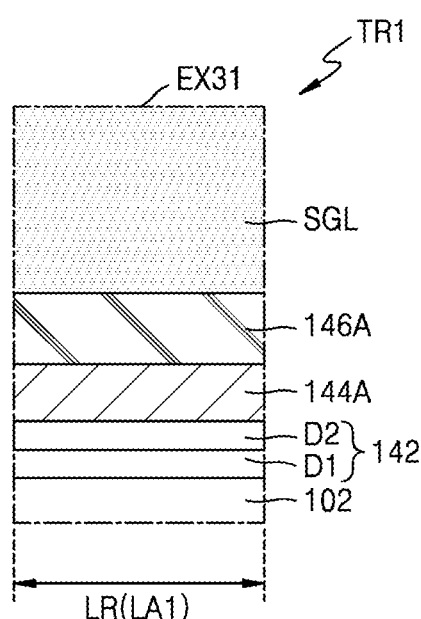
FIG. 6 is an enlarged cross-sectional view of an example configuration of portion "EX31" of FIG. 3.

FIG. 6 is an enlarged cross-sectional view of an example configuration of portion "EX31" of FIG. 3.

Referring to FIG. 6, a first gate dielectric film 142A may include a stack structure of an interface dielectric film D1 and a high-k dielectric film D2. In a logic region LR, a bottom surface of the interface dielectric film D1 may be in contact with a first active region A1 of a substrate 102, and the high-k dielectric film D2 may be between the interface dielectric film D1 and a first work-function control metal film 144A. Details of the interface dielectric film D1 and the high-k dielectric film D2 are the same as those described with reference to FIG. 5.

Referring again to embodiments as shown in FIGS. 2A, 2B, and 3, the first work-function control metal film 144A may include the same material as a work-function control metal film 144 included in the selection gate structure SGS in the memory region MR. For example, the first work-function control metal film 144A may include lanthanum (La).

In embodiments, the first work-function control metal nitride film 146A may include the same material as the lower work-function control metal nitride film 146L and the upper work-function control metal nitride film 146U, which are included in the selection gate structure SGS in the memory region MR. For example, the first work-function control metal nitride film 146A may include titanium nitride (TiN). As used herein, the lower work-function control metal nitride film 146L included in the selection gate structure SGS in the memory region MR may be referred to as a first lower work-function control film, and the first work-function control metal nitride film 146A included in the first logic transistor TR1 in the logic region LR may be referred to as a second work-function control film.

As shown in FIG. 3, the second logic transistor TR2 may include a second gate G2 on the substrate 102, a second gate dielectric film 142B, a second work-function control metal film 144B, and a second work-function control metal nitride film 146B, which are sequentially stacked between a second active region A2 of the substrate 102 and the second gate G2, and a pair of second source/drain regions 160B, which are located to be one on each side of the second gate G2 inside a second well W2 of the second active region A2. A sidewall of each of the second gate dielectric film 142B, the second work-function control metal film 144B, the second work-function control metal nitride film 146B, and the second gate G2 may be covered by an insulating spacer 152.

In embodiments, the second gate dielectric film 142B may include the same material as a portion of the selection gate dielectric film 142 included in the selection gate structure SGS in the memory region MR.

Figure 7:
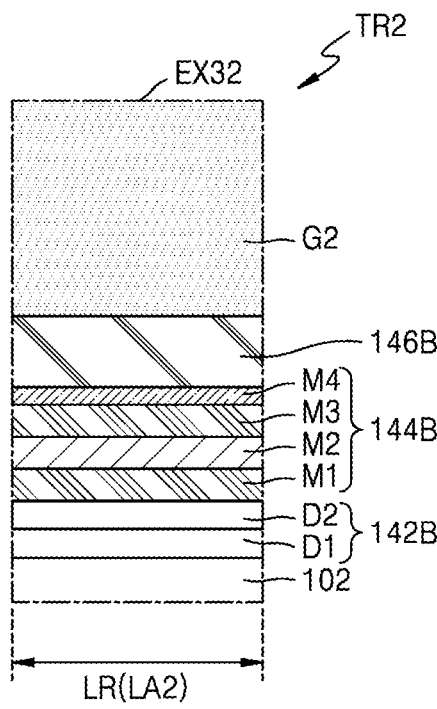
FIG. 7 is an enlarged cross-sectional view of an example configuration of portion "EX32" of FIG. 3.

FIG. 7 is an enlarged cross-sectional view of an example configuration of portion "EX32" of FIG. 3.

Referring to FIG. 7, a second gate dielectric film 142B may include a stack structure of an interface dielectric film D1 and a high-k dielectric film D2. In the logic region LR, a bottom surface of the interface dielectric film D1 may be in contact with a second active region A2 of a substrate 102, and the high-k dielectric film D2 may be located between the interface dielectric film D1 and a second work-function control metal film 144B. Details of the interface dielectric film D1 and the high-k dielectric film D2 will be described as those described with reference to FIG. 5. In embodiments, the second gate dielectric film 142B may have the same structure as the first gate dielectric film 142A on the first active region A1 of the substrate 102.

In embodiments, the second work-function control metal film 144B may include a TiN film, a La film, an Al film, or a combination thereof. For example, as shown in FIG. 7 the second work-function control metal film 144B may include a first TiN film M1, an Al film M2, a second TiN film M3, and a La film M4, which are sequentially stacked on the second gate dielectric film 142B.

Referring to FIGS. 2A, 2B, and 3 again, in embodiments, a second work-function control metal nitride film 146B may include the same material as the lower work-function control metal nitride film 146L and the upper work-function control metal nitride film 146U, which are included in the selection gate structure SGS in the memory region MR. For example, the second work-function control metal nitride film 146B may include TiN. As used herein, the lower work-function control metal nitride film 146L included in the selection gate structure SGS in the memory region MR may be referred to as a first lower work-function control film, and the second work-function control metal nitride film 146B included in the second logic transistor TR2 in the logic region LR may be referred to as a second work-function control film.

Figure 4:
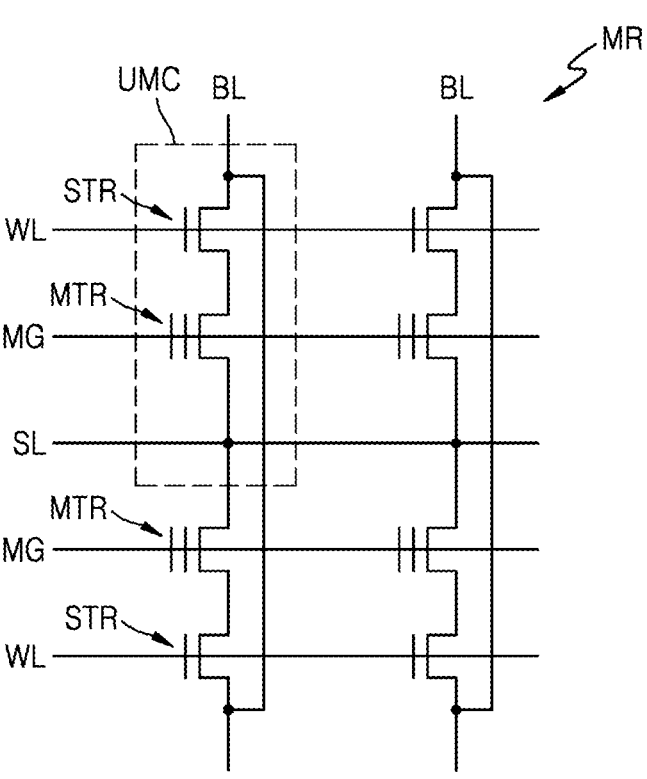
FIG. 4 is a circuit diagram of a unit memory cell included in a memory region of an IC device according to embodiments.

FIG. 4 is a circuit diagram of a unit memory cell UMC included in a memory region MR of the IC device 100 shown in FIGS. 2A to 2C.

Referring to FIG. 4, the memory region MR of the IC device 100 may include a plurality of unit memory cells UMC. Each of the plurality of unit memory cells UMC may include one selection transistor STR and one memory transistor MTR. A gate of a selection transistor STR may constitute a word line WL. A gate of the memory transistor MTR may constitute a memory gate line MG.

Two unit memory cells UMC adjacent to each other may share one source line SL therebetween and be symmetrically arranged about the one source line SL. The source line SL may correspond to the first impurity region 128 shown in FIGS. 2B and 2C. A bit line of the selection transistor STR may correspond to the second impurity region 180 shown in FIGS. 2B and 2C.

As shown in FIGS. 2B, 2C, and 3, the selection transistor STR including the selection gate structure SGS, the memory transistor MTR, and the erase gate line EGL, which are in the memory region MR, and the first logic transistor TR1 and the second logic transistor TR2, which are in the logic region LR, may be covered by an interlayer insulating film 190. The interlayer insulating film 190 may include a silicon oxide film, as a non-limiting example.

As shown in FIGS. 2A and 2C, a plurality of bit line contacts 180C may be located in the memory region MR. Each of the plurality of bit line contacts 180C may be connected to the second impurity region 180 by passing through the interlayer insulating film 190. Each of the plurality of bit line contacts 180C may include a metal, a conductive metal nitride, or a combination thereof. For example, each of the plurality of bit line contacts 180C may include tungsten (W), copper (Cu), aluminum (Al), titanium (Ti), tantalum (Ta), titanium nitride (TiN), tantalum nitride (TaN), an alloy thereof, or a combination thereof. In some embodiments, a metal silicide film may be between the second impurity region 180 and the bit line contact 180C.

In the IC device 100 described with reference to FIGS. 2A to 2C and 3, the lower work-function control metal nitride film 146L and the upper work-function control metal nitride film 146U, which are portions of the selection gate structure SGS included in the selection transistor STR, may be spaced apart from each other in a vertical direction (Z direction), and a gate protrusion SGP of the selection gate line SGL may be located between the lower work-function control metal nitride film 146L and the upper work-function control metal nitride film 146U. In a process of manufacturing a logic embedded flash memory device, including a split gate-type transistor, even when a portion (e.g., the upper work-function control metal nitride film 146U) of a work-function control metal-containing film included in the selection transistor STR is exposed to a vulnerable etching atmosphere, the lower work-function control metal nitride film 146L, which affects the performance of the selection transistor STR, may be prevented from being exposed to the etching atmosphere. Therefore, the reliability of the IC device 100 may be improved.

Figure 8:
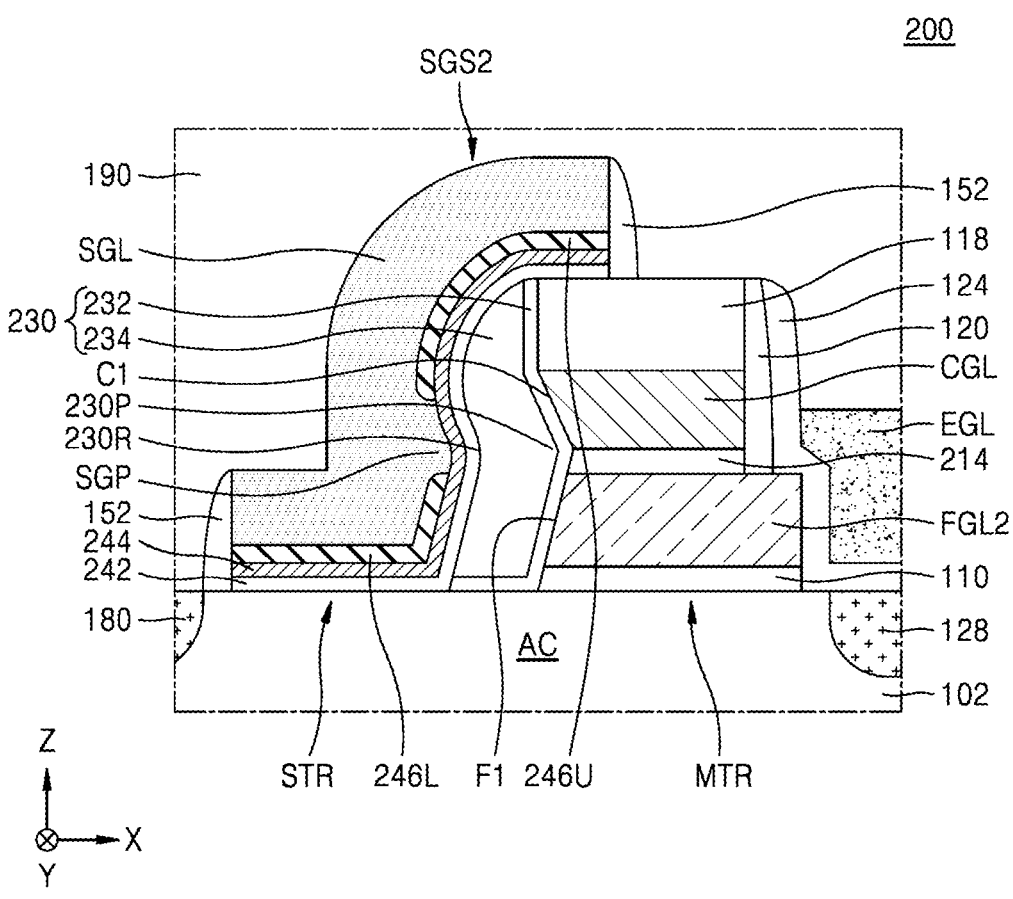
FIG. 8 is a cross-sectional view of an IC device according to embodiments.

FIG. 8 is a cross-sectional view of an IC device 200 according to embodiments. FIG. 8 illustrates an enlarged cross-sectional configuration of a portion corresponding to portion "EX1" of FIG. 2B. In FIG. 8, the same reference numerals are used to denote the same reference elements as in FIGS. 2A to 2C, and detailed descriptions thereof are not repeated.

Referring to FIG. 8, the IC device 200 may substantially have the same configuration as the IC device 100 described with reference to FIGS. 2A to 2C and 3. However, in the IC device 200, a memory transistor MTR may include a floating gate line FGL2 between a substrate 102 and a control gate line CGL and a dielectric film 214 between the floating gate line FGL2 and the control gate line CGL.

One sidewall of each of the first tunnel insulating film 110, the floating gate line FGL2, the dielectric film 214, the control gate line CGL, and the capping layer 118 may be covered by an insulating spacer 230. The insulating spacer 230 may include a double layer of a silicon oxide film 232 and a silicon nitride film 234. The silicon oxide film 232 may be in contact with one sidewall of each of the floating gate line FGL2 and the control gate line CGL. The silicon nitride film 234 may cover one sidewall of each of the floating gate line FGL2 and the control gate line CGL on the silicon oxide film 232.

The sidewall of the floating gate line FGL2, which faces the insulating spacer 230, may include a second inclined surface F1 that is inclined such that a width of the floating gate line FGL2 in a first lateral direction (X direction) increases toward the substrate 102. The insulating spacer 230 may include a protrusion 230P that faces a first inclined surface C1 of the control gate line CGL and the second inclined surface F1 of the floating gate line FGL2. The protrusion 230P of the insulating spacer 230 may have a shape protruding toward the floating gate line FGL2 of the control gate line CGL. The insulating spacer 230 may include a recess 230R facing a selection gate line SGL on an opposite side of the protrusion 230P. The recess 230R of the insulating spacer 230 may be concave toward the selection gate line SGL.

A selection gate structure SGS2 may be spaced apart from the memory transistor MTR in the first lateral direction (X direction) with the insulating spacer 230 therebetween. The selection gate structure SGS2 may substantially have the same configuration as the selection gate structure SGS described with reference to FIGS. 2B and 2C. In some implementations, the selection gate structure SGS2 may include a selection gate dielectric film 242, a work-function control metal film 244, a lower work-function control metal nitride film 246L, an upper work-function control metal nitride film 246U, and the selection gate line SGL, which are sequentially stacked on a main surface 110M of the substrate 102. An uppermost surface of the lower work-function control metal nitride film 246L may be at the same vertical level as or at a lower vertical level than the recess 230R included in the insulating spacer 230.

Details of the selection gate dielectric film 242, the work-function control metal film 244, the lower work-function control metal nitride film 246L, and the upper work-function control metal nitride film 246U may substantially be the same as those of the selection gate dielectric film 142, the work-function control metal film 144, the lower work-function control metal nitride film 146L, and the upper work-function control metal nitride film 146U, which have been described with reference to FIGS. 2B to 2C. As used herein, the work-function control metal film 244, the lower work-function control metal nitride film 246L, and the upper work-function control metal nitride film 246U may be respectively referred to as a work-function control film, a lower work-function control film, and an upper work-function control film. In addition, as used herein, the lower work-function control metal nitride film 246L and the upper work-function control metal nitride film 246U may be respectively referred to as a lower metal nitride film and an upper metal nitride film.

In the IC device 200 described with reference to FIG. 8, similarly to the description of the IC device 100 with reference to FIGS. 2A to 2C and 3, the lower work-function control metal nitride film 246L and the upper work-function control metal nitride film 246U, which are portions of the selection gate structure SGS2 included in a selection transistor STR, may be spaced apart from each other in a vertical direction (Z direction). A gate protrusion SGP of the selection gate line SGL may be between the lower work-function control metal nitride film 246L and the upper work-function control metal nitride film 246U. Accordingly, in the process of manufacturing the IC device 200, even if the upper work-function control metal nitride film 246U were to be exposed to a vulnerable etching atmosphere, the lower work-function control metal nitride film 246L, which affects the performance of the selection transistor STR, may be prevented from being exposed to the etching atmosphere. Accordingly, the reliability of the IC device 200 may be improved.

Figure 9:
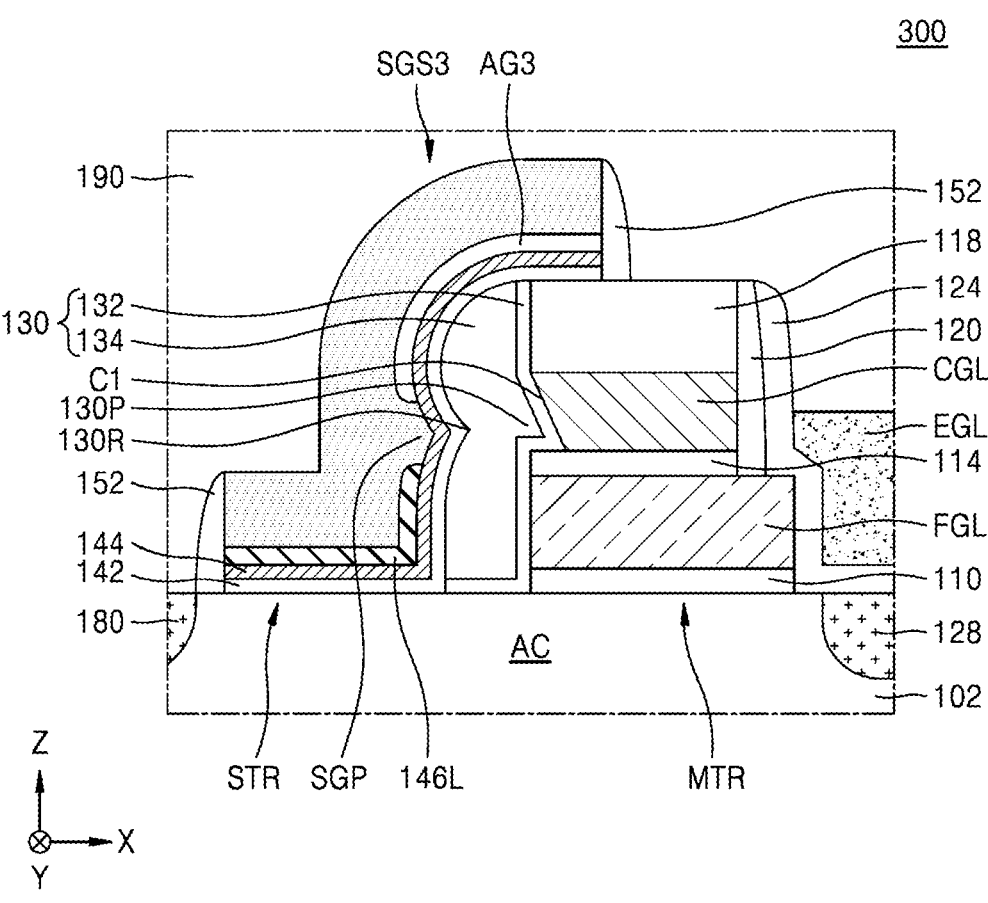
FIG. 9 is a cross-sectional view of an IC device according to embodiments.

FIG. 9 is a cross-sectional view of an IC device 300 according to embodiments. FIG. 9 illustrates an enlarged cross-sectional configuration of a portion corresponding to portion "EX1" of FIG. 2B. In FIG. 9, the same reference numerals are used to denote the same reference elements as in FIGS. 2A to 2C, and detailed descriptions thereof are not repeated.

Referring to FIG. 9, the IC device 300 may have substantially the same configuration as the IC device 100 described with reference to FIGS. 2A to 2C and 3. However, the IC device 300 may include a selection gate structure SGS3. The selection gate structure SGS3 may have substantially the same configuration as the selection gate structure SGS described with reference to FIGS. 2B and 2C. In some implementations, the selection gate structure SGS3 may include an air gap AG3 instead of the upper work-function control metal nitride film 146U. As used herein, the term "air gap" may refer to a space including other gases that may be in the atmosphere or during a manufacturing process. The air gap AG3 may be between a selection gate line SGL and an insulating spacer 130, or specifically, between the selection gate line SGL and a work-function control metal film 144. The air gap AG3 may be spaced apart from a lower work-function control metal nitride film 146L in a vertical direction (Z direction). A gate protrusion SGP may be between the lower work-function control metal nitride film 146L and the air gap AG3.

Figure 10:
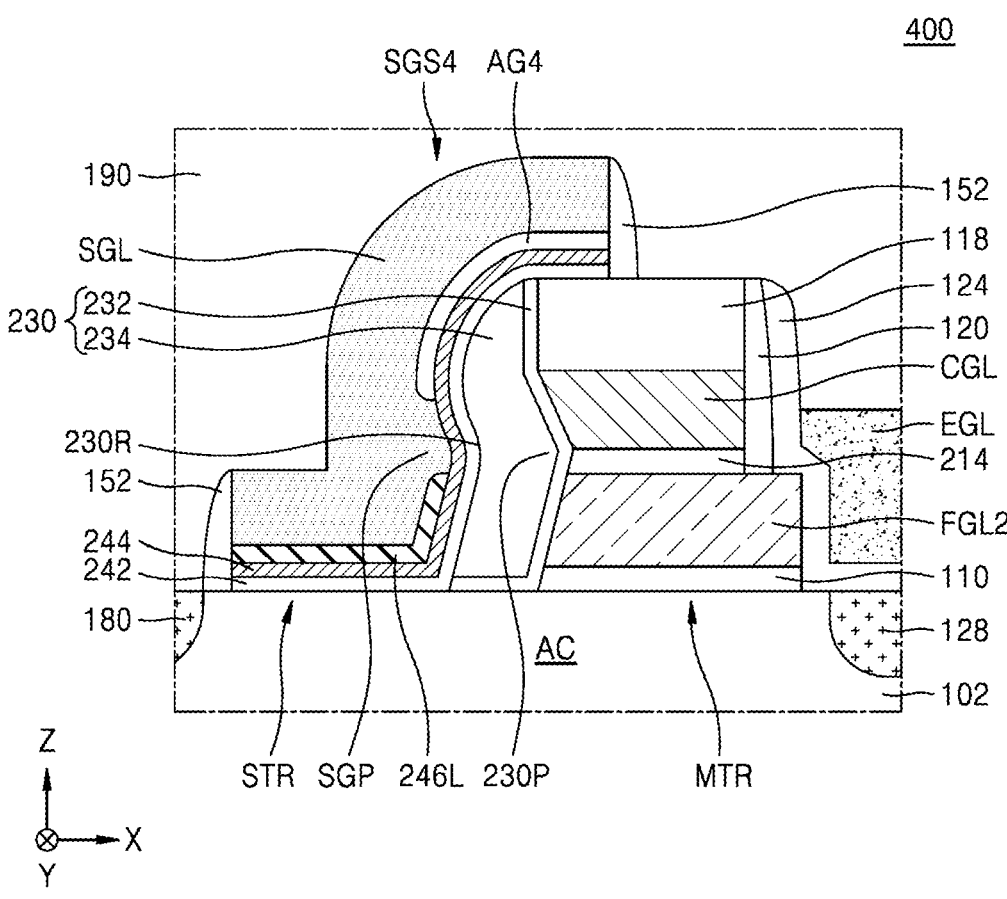
FIG. 10 is a cross-sectional view of an IC device according to embodiments.

FIG. 10 is a cross-sectional view of an IC device 400 according to embodiments. FIG. 10 illustrates an enlarged cross-sectional configuration of a portion corresponding to portion "EX1" of FIG. 2B. In FIG. 10, the same reference numerals are used to denote the same reference elements as in FIGS. 2A to 2C and 8, and detailed descriptions thereof are omitted.

Referring to FIG. 10, the IC device 400 may have substantially the same configuration as the IC device 200 described with reference to FIG. 8. In some implementations, the IC device 400 may include a selection gate structure SGS4. The selection gate structure SGS4 may have substantially the same configuration as the selection gate structure SGS2 described with reference to FIG. 8. However, the selection gate structure SGS4 may include an air gap AG4 instead of the upper work-function control metal nitride film 246U. The air gap AG4 may be between a selection gate line SGL and an insulating spacer 330, or specifically, between the selection gate line SGL and a work-function control metal film 344. The air gap AG4 may be spaced apart from a lower work-function control metal nitride film 246L in a vertical direction (Z direction). A gate protrusion SGP of the selection gate line SGL may be between the lower work-function control metal nitride film 246L and the air gap AG4.

In the IC devices 300 and 400 described with reference to FIGS. 9 and 10, similar to the description of the IC device 100 with reference to FIGS. 2A to 2C and 3, the lower work-function control metal nitride film 146L or 246L, which is a portion of the selection gate structure SGS included in the selection transistor STR, may be spaced apart from the air gap AG3 or AG4 in the vertical direction (Z direction). The gate protrusion SGP of the selection gate line SGL may be between the lower work-function control metal nitride film 146L or 246L and the air gap AG3 or AG4. Accordingly, in the process of manufacturing the IC device 300 or 400, the lower work-function control metal nitride film 146L, which affects the performance of the selection transistor STR, may be prevented from being exposed to a vulnerable etching atmosphere. Therefore, the reliability of the IC devices 300 and 400 may be improved.

Figure 11A:
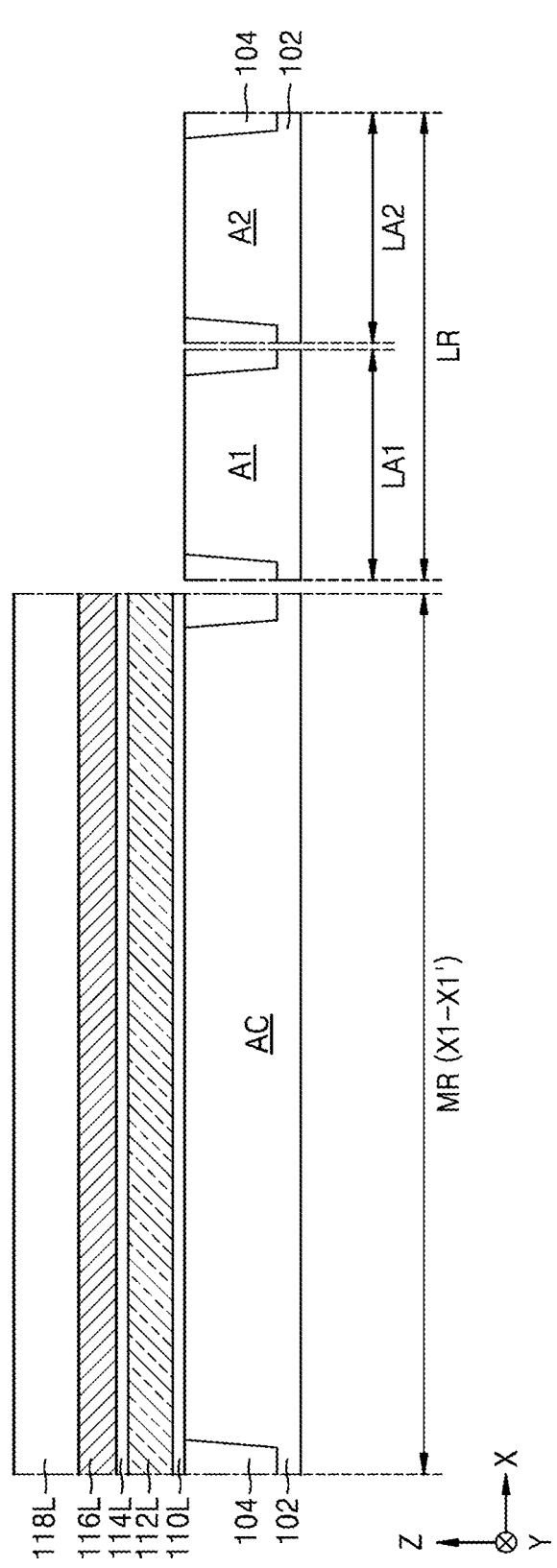
FIGS. 11A to 11Q are cross-sectional views of a process sequence of a method of manufacturing an IC device, according to embodiments.
Figure 11B:
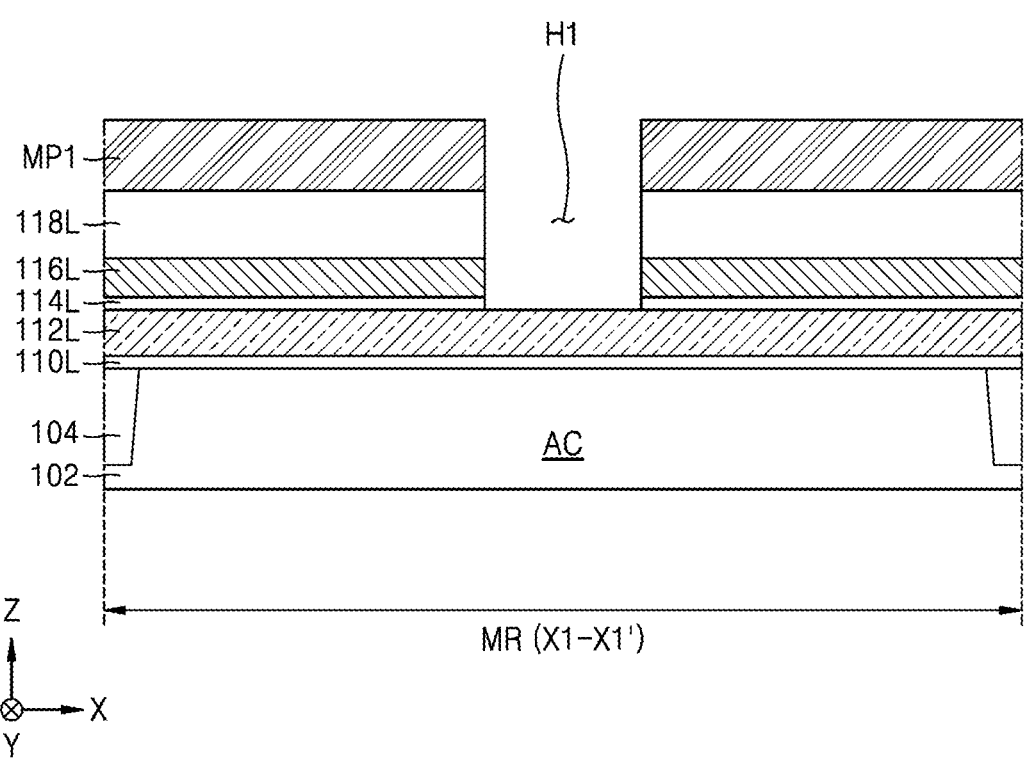
Figure 11C:
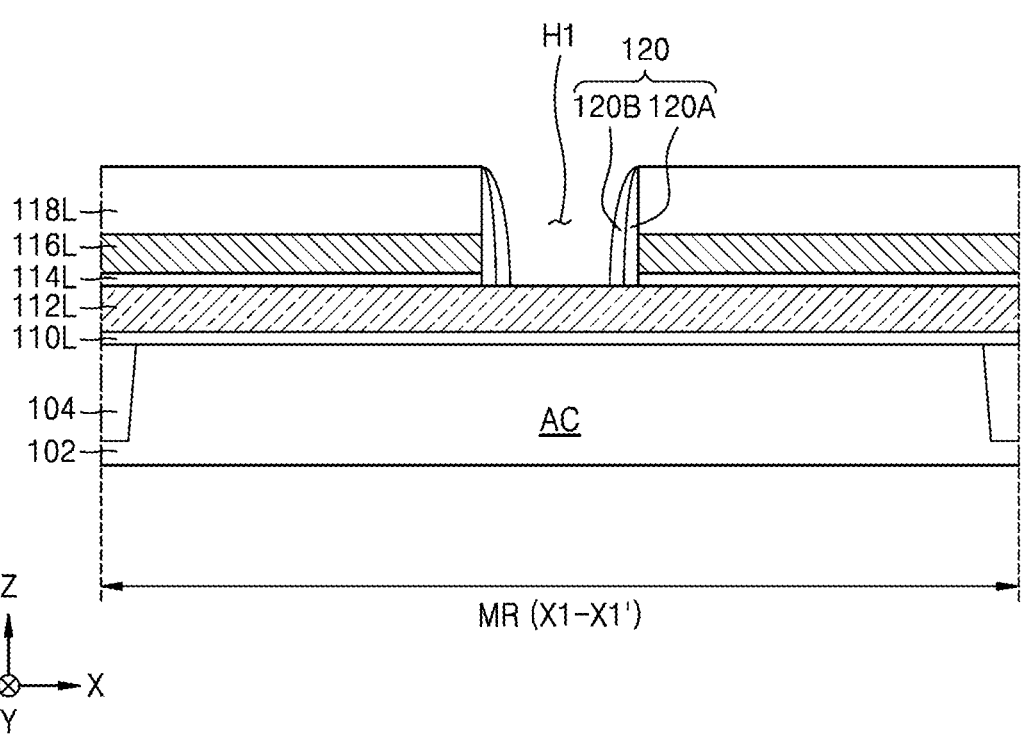
Figure 11D:
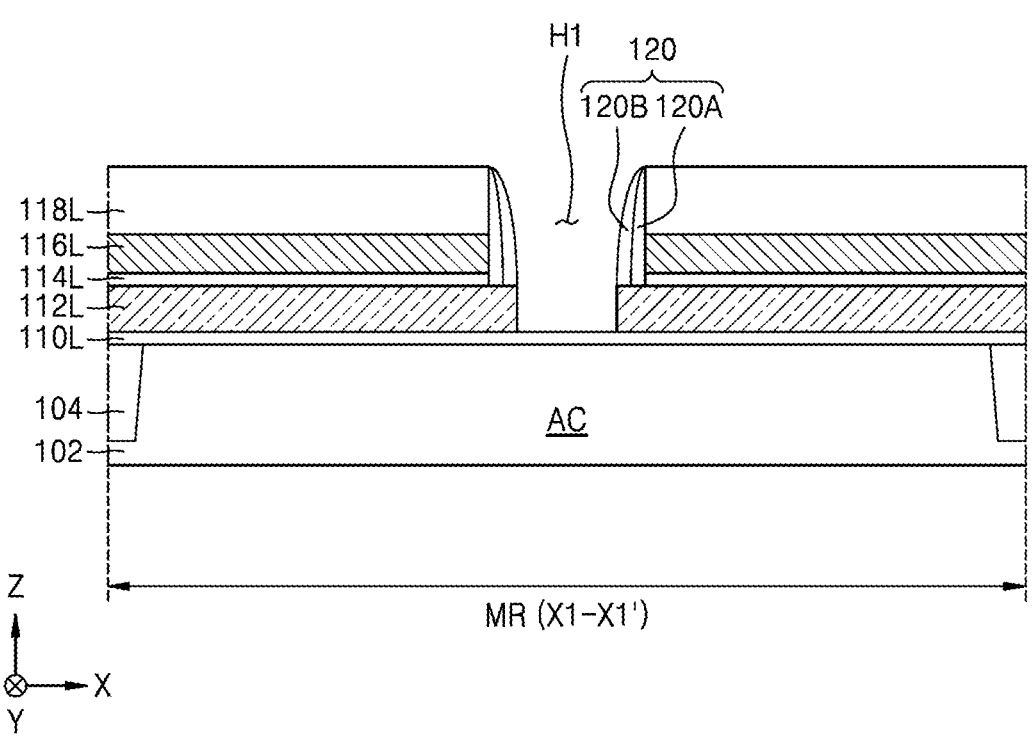
Figure 11E:
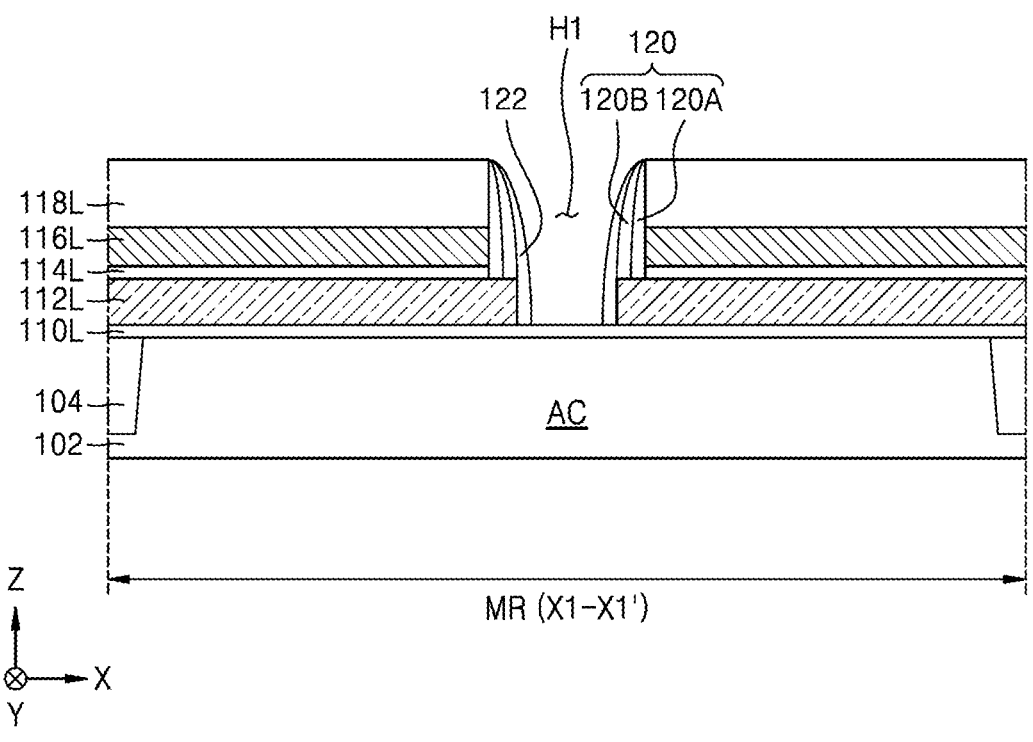
Figure 11F:
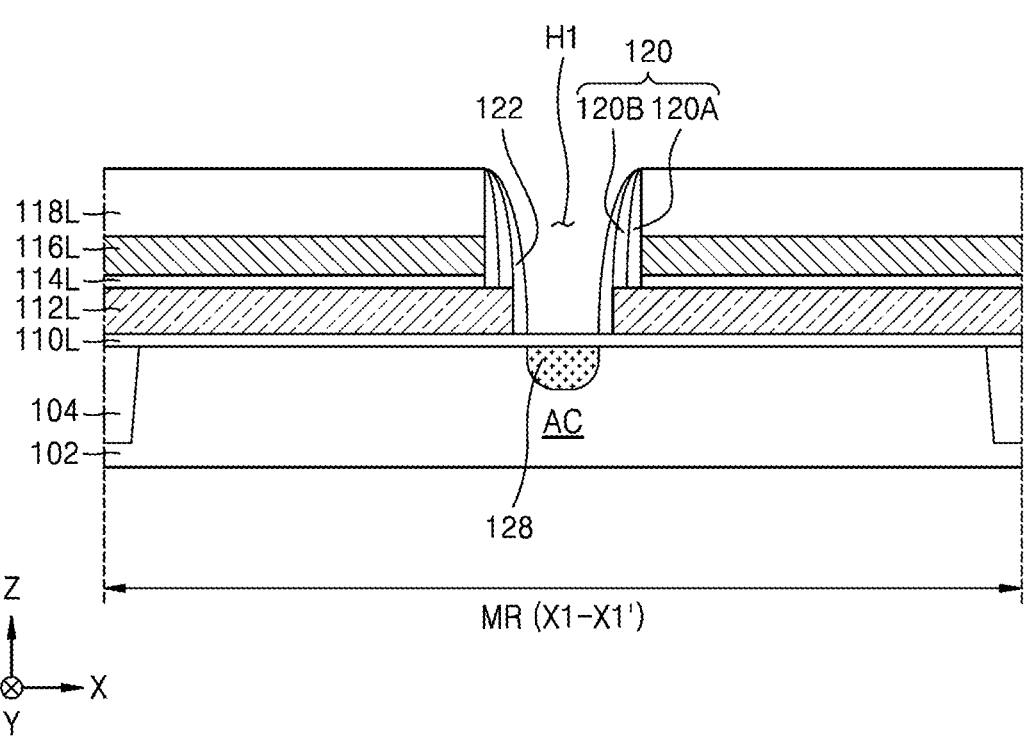
Figure 11G:
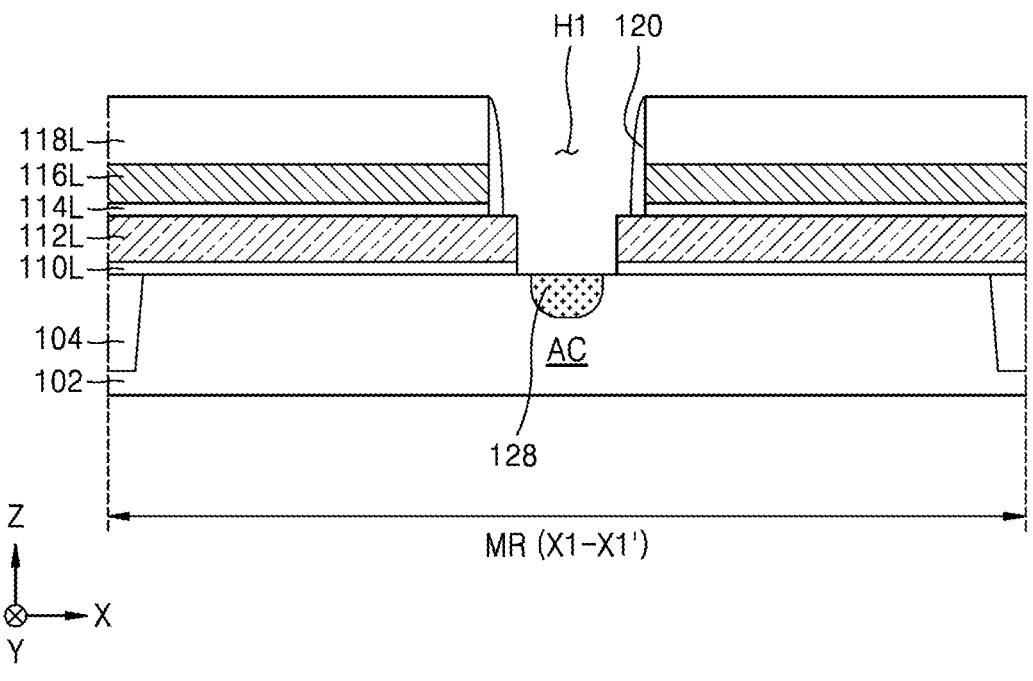
Figure 11H:
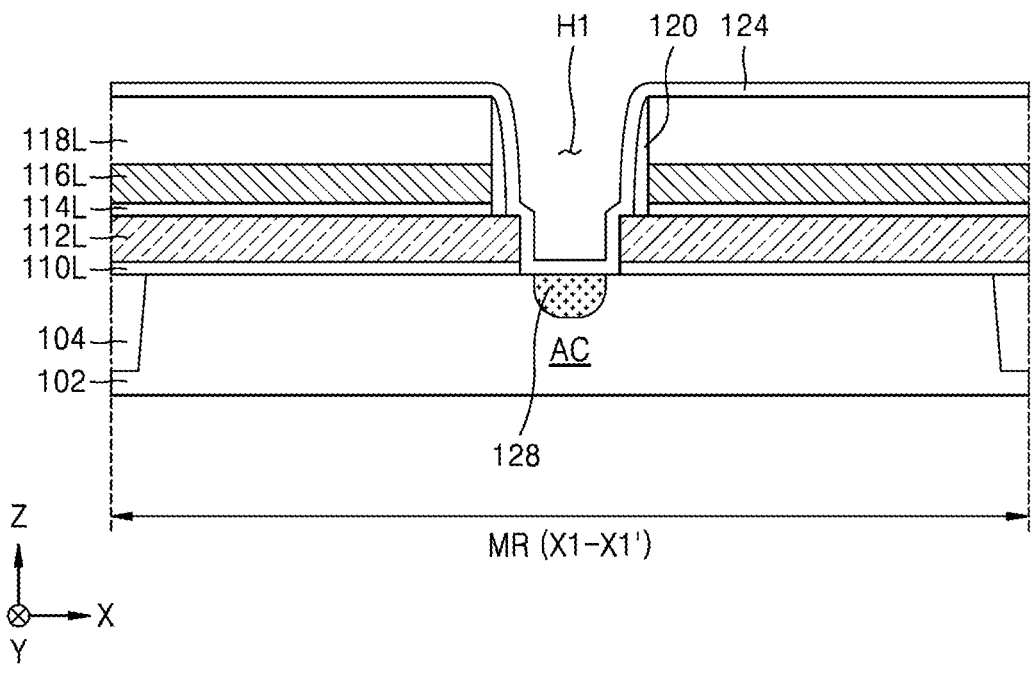
Figure 11I:
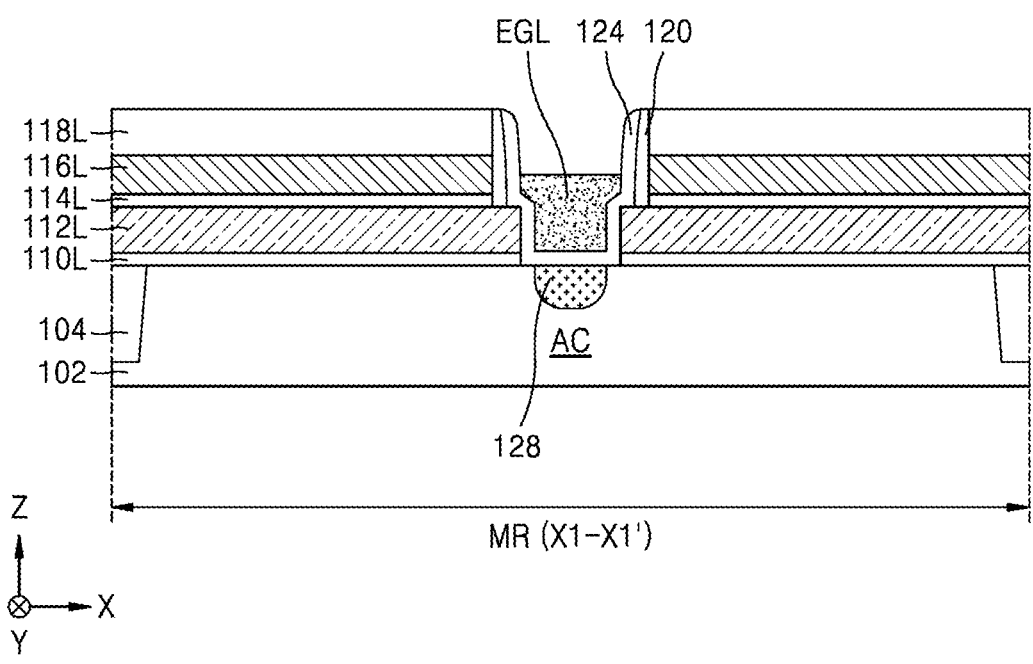
Figure 11J:
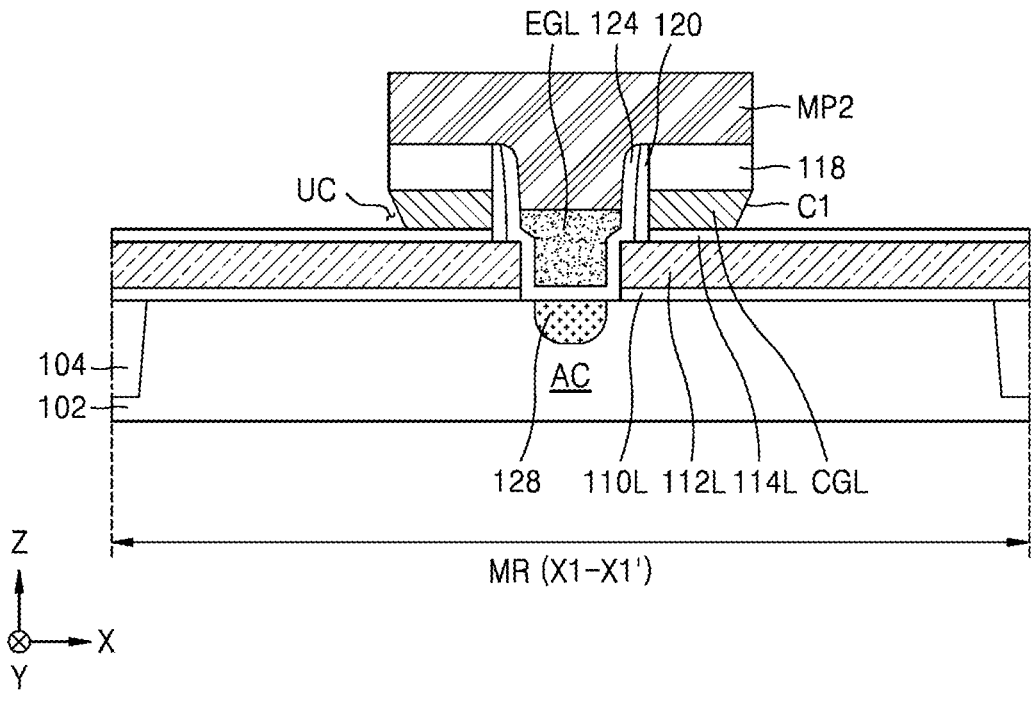
Figure 11K:
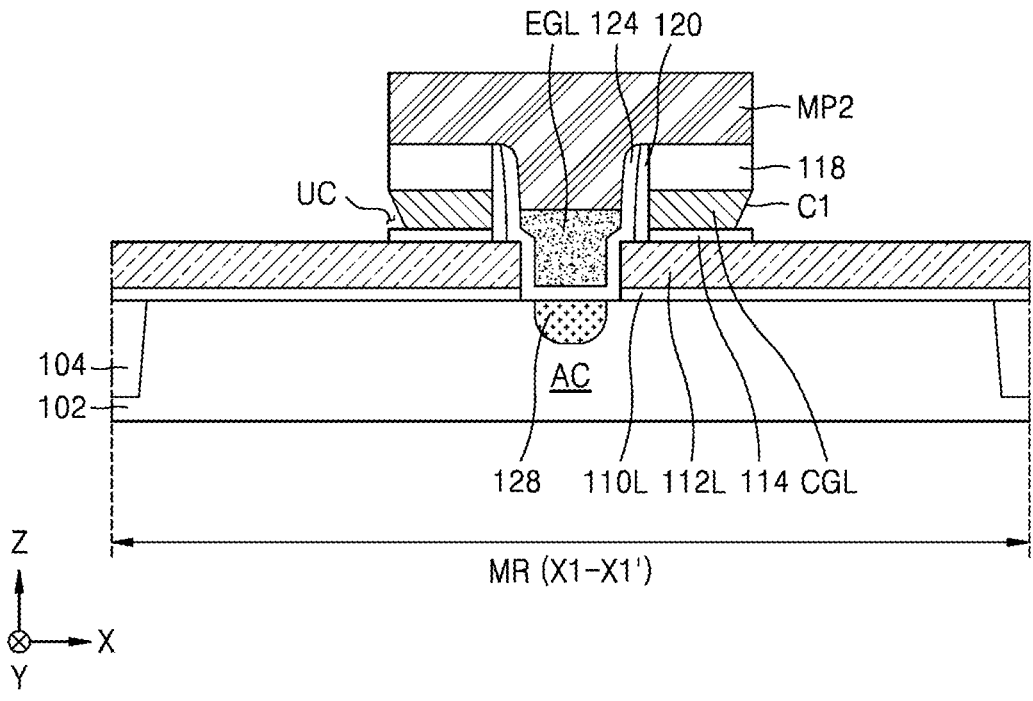
Figure 11L:
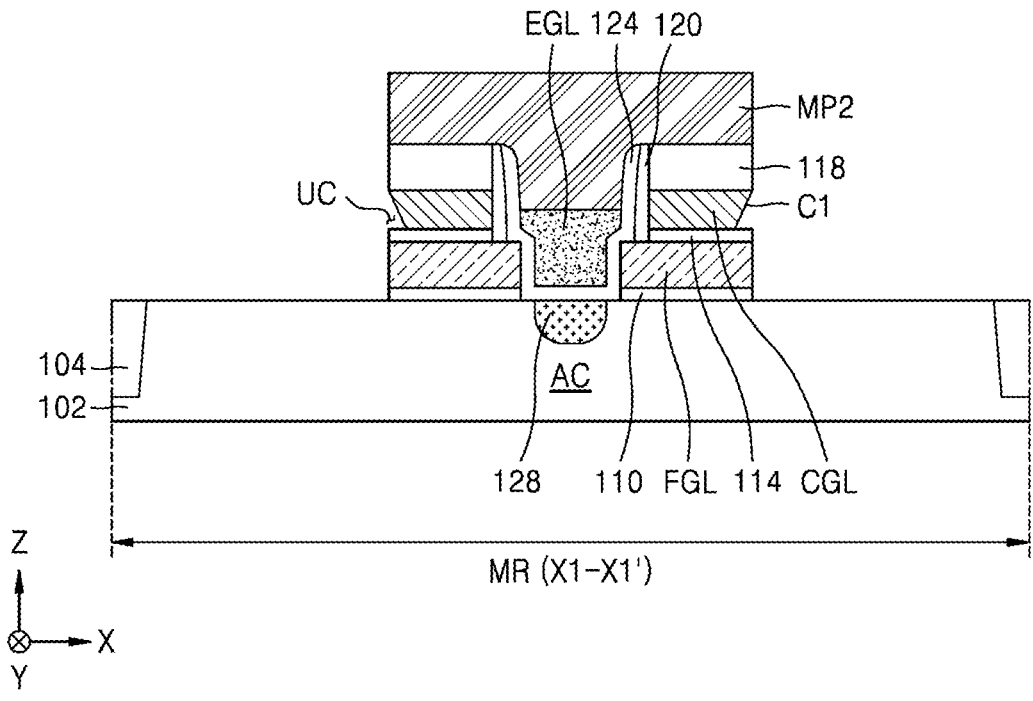
Figure 11M:
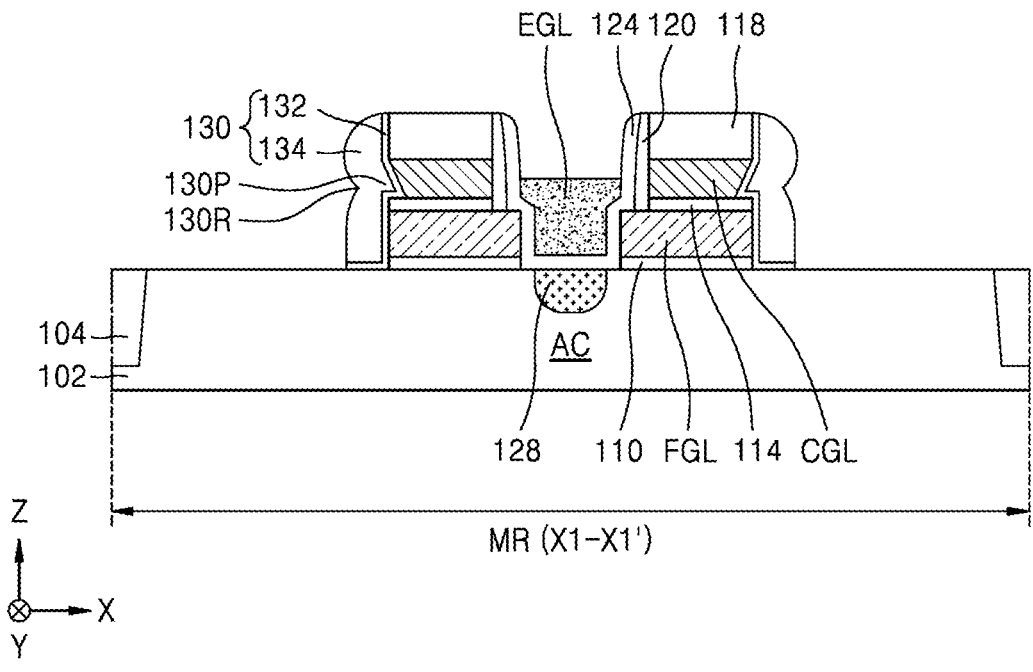
Figure 11N:
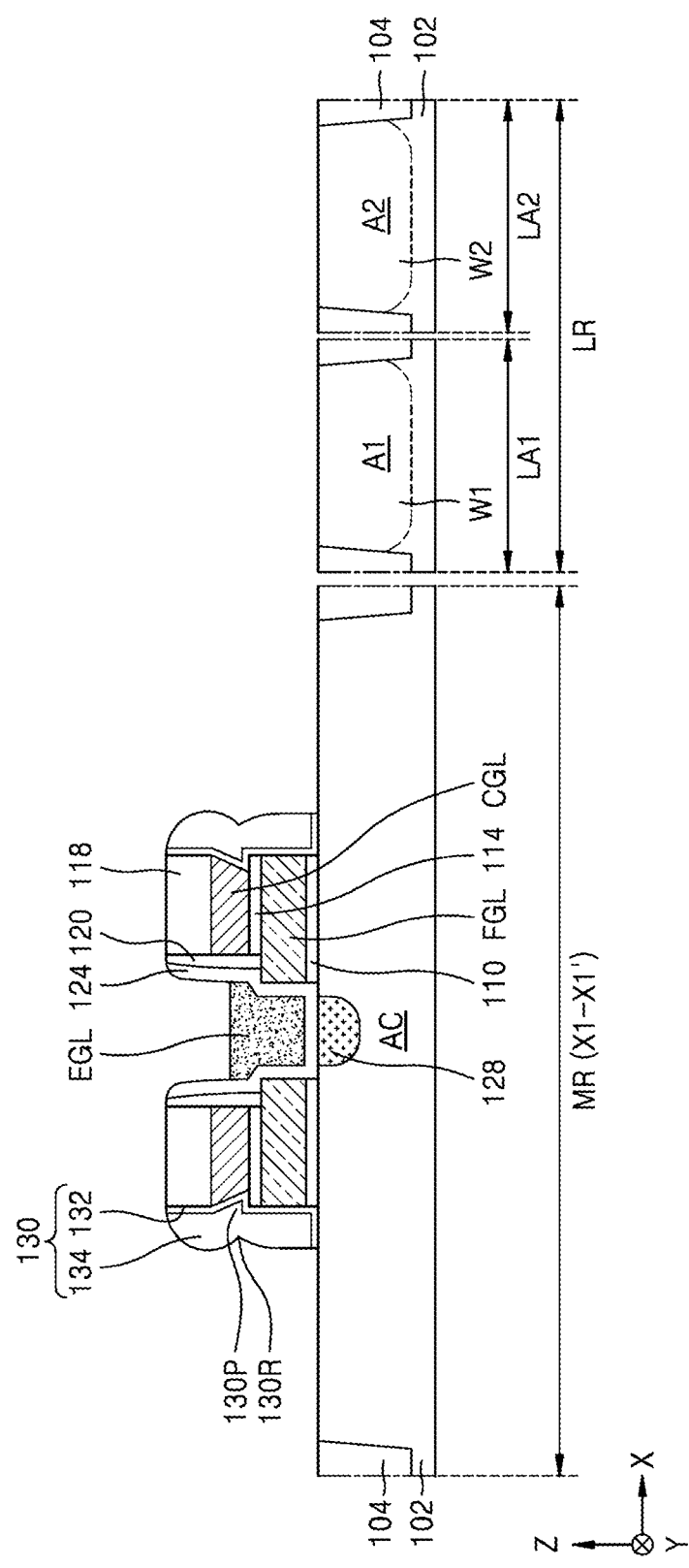
Figure 110:
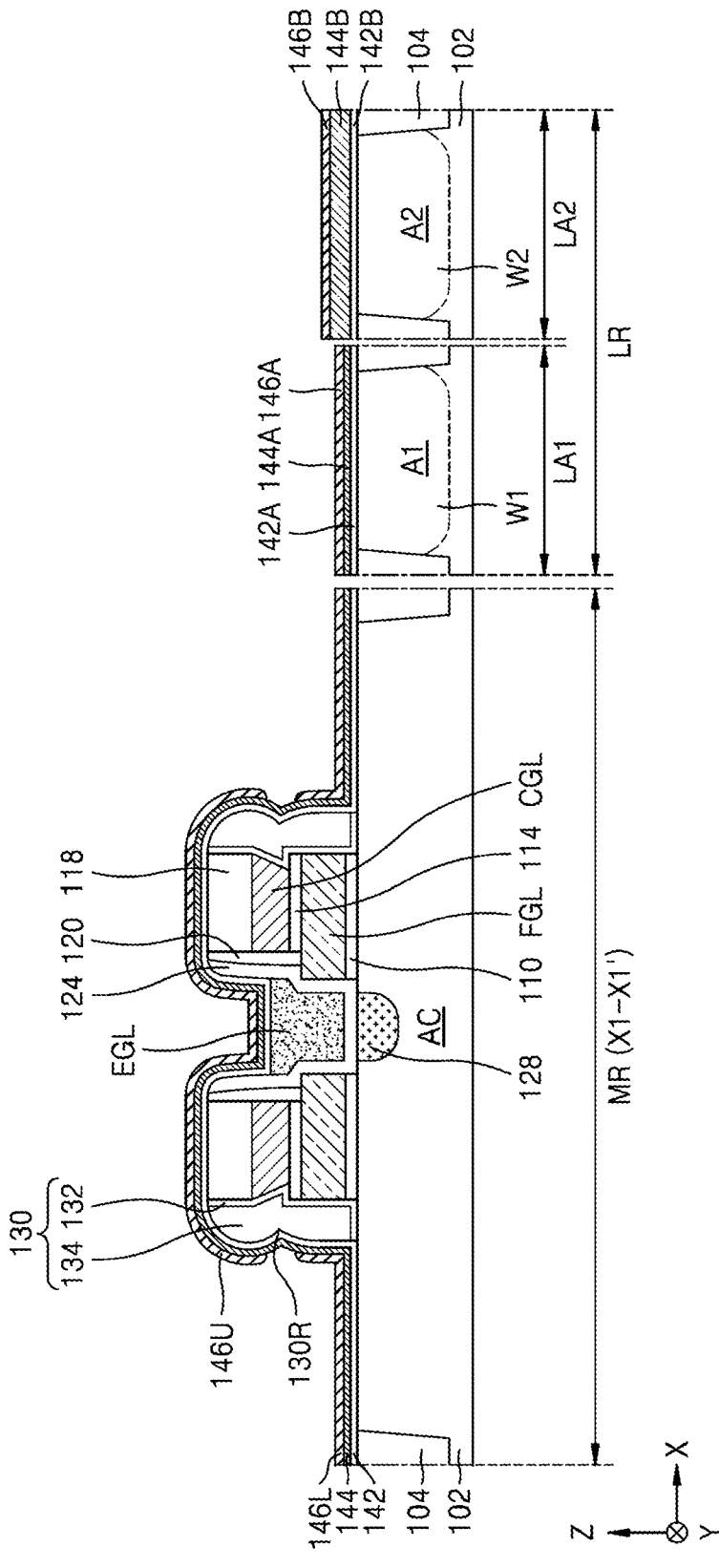
Figure 11P:
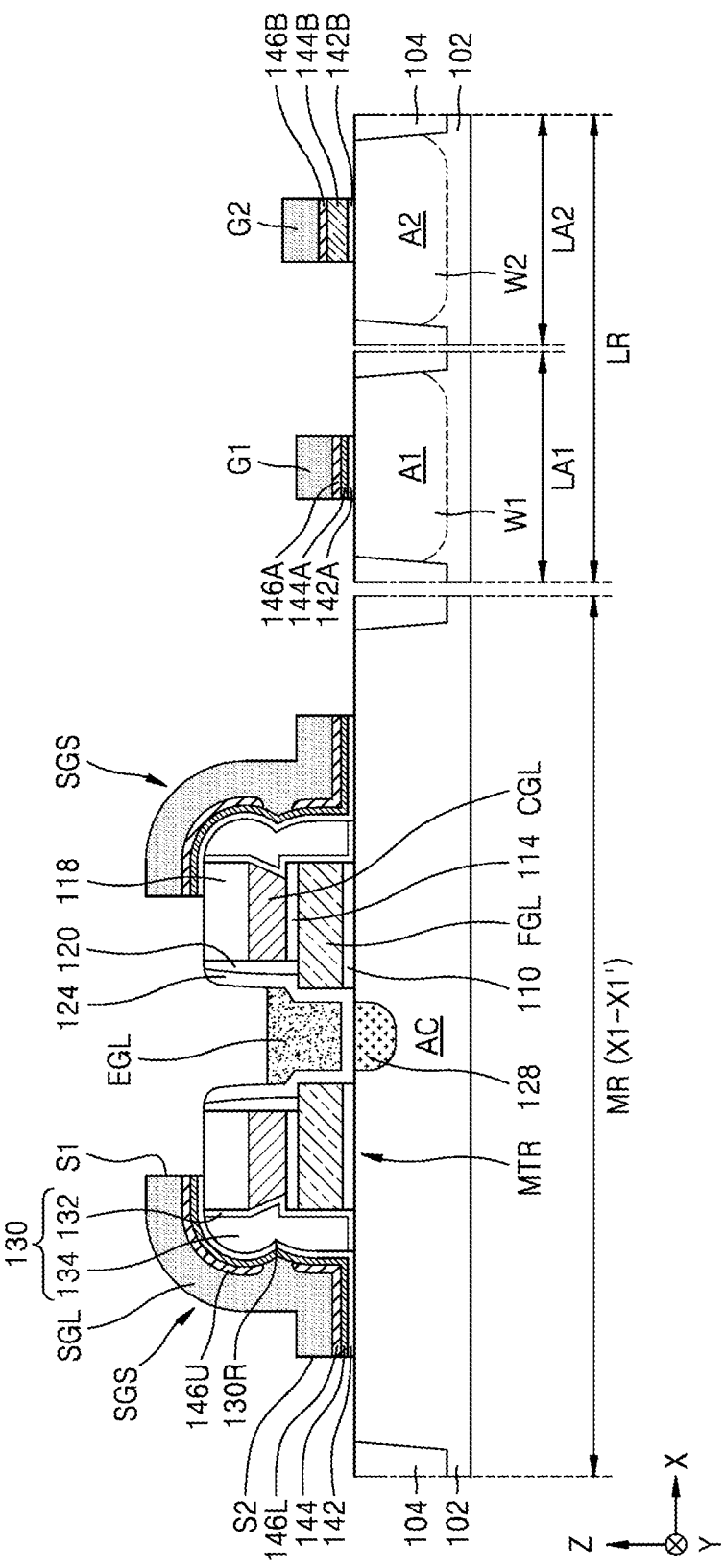
Figure 11Q:
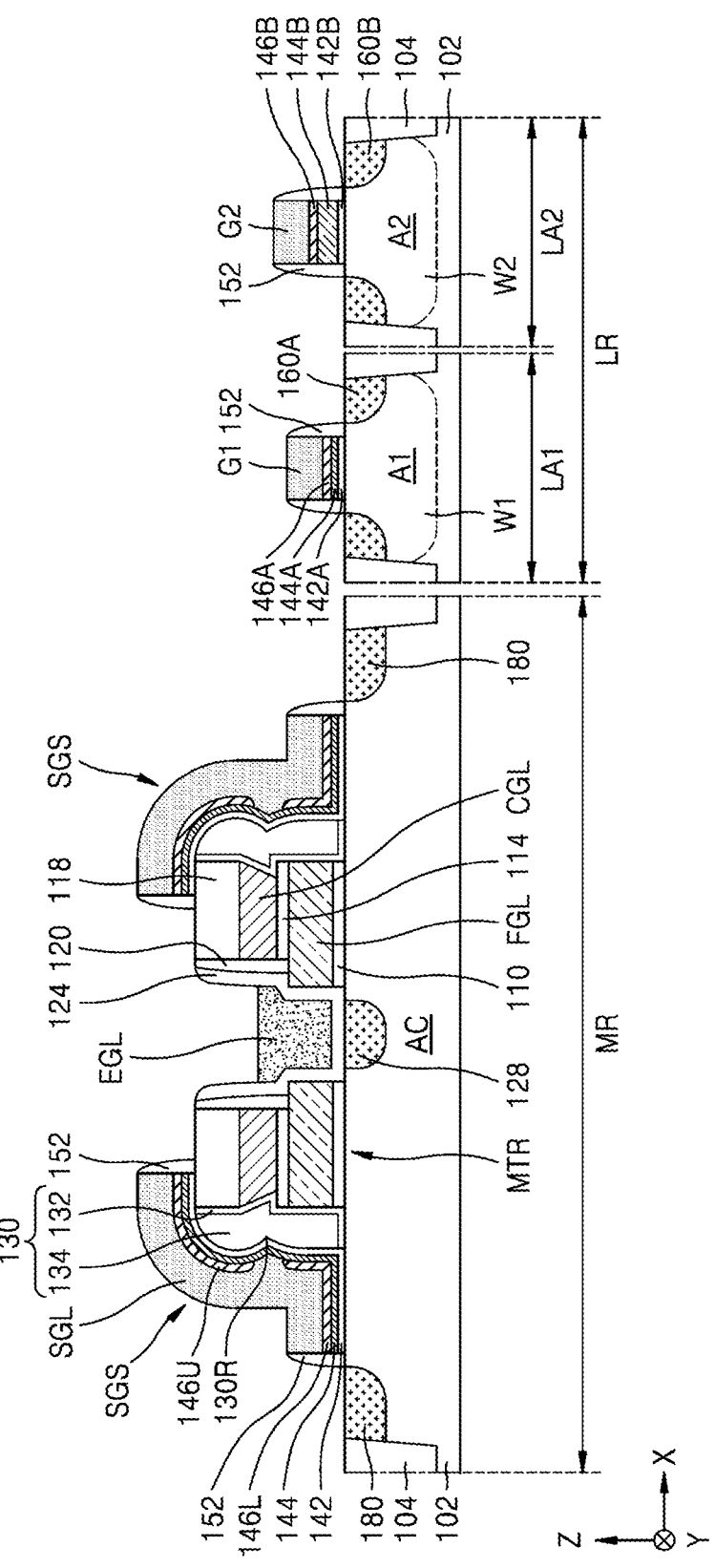

FIGS. 11A to 11Q are cross-sectional views of a process sequence of a method of manufacturing an IC device, according to embodiments. An example of a method of manufacturing the IC device 100, described with reference to FIGS. 2A to 2C and 3, will be described with reference to FIGS. 11A to 11Q. Components of a portion corresponding to a cross-section taken along line X1-X1' of FIG. 2A in a memory region MR, according to a process sequence, are illustrated in FIGS. 11A to 11Q. Components of a logic region LR, according to the process sequence, are further illustrated in FIGS. 11A, 11N, 11O, 11P, and 11Q. In FIGS. 11A to 11Q, the same reference numerals are used to denote the same reference elements as in FIGS. 2A to 2C and 3, and detailed descriptions thereof are not repeated.

Referring to FIG. 11A, a substrate 102 including the memory region MR and the logic region LR may be prepared. A plurality of device isolation films 104 may be formed in the substrate 102 to define an active region AC in the memory region MR. A first active region A1 and a second active region A2 may be defined in the logic region LR. The first active region A1 may be in a first region LA1, and the second active region A2 may be in a second region LA2.

In the memory region MR, a tunnel insulating film 110L, a first conductive film 112L, a dielectric film 114L, a second conductive film 116L, and a capping layer 118L may be sequentially formed on the substrate 102. Respective constituent materials of the tunnel insulating film 110L, the first conductive film 112L, the dielectric film 114L, the second conductive film 116L, and the capping layer 118L may be the same as those of the first tunnel insulating film 110, the floating gate line FGL, the dielectric film 114, and the control gate line CGL, which have been described with reference to FIGS. 2B and 2C.

Referring to FIG. 11B, a mask pattern MP1 may be formed on the resultant structure of FIG. 11A in the logic region LR and the memory region MR. While the logic region LR is covered by the mask pattern MP1, a portion of each of the capping layer 118L, the second conductive film 116L, and the dielectric film 114L may be etched in the memory region MR to form an opening H1. A top surface of the first conductive film 112L may be exposed at a bottom surface of the opening H1. In embodiments, the mask pattern MP1 may include a photoresist pattern.

Referring to FIG. 11C, the mask pattern MP1 may be removed from the resultant structure of FIG. 11B. While the logic region LR is covered by a mask pattern (not shown), an insulating spacer 120 covering a sidewall of each of the dielectric film 114L, the second conductive film 116L, and the capping layer 118L, which are exposed through the opening H1, may be formed in the memory region MR. In embodiments, the insulating spacer 120 may have a stack structure of a silicon nitride film 120A and a silicon oxide film 120B.

Referring to FIG. 11D, in the resultant structure of FIG. 11C, the first conductive film 112L, which is exposed, may be etched by using the capping layer 118L and the insulating spacer 120 as an etch mask, and thus, the tunnel insulating film 110L may be exposed inside the opening H1.

Referring to FIG. 11E, in the resultant structure of FIG. 11D, a mask spacer 122 covering a sidewall of each of the insulating spacer 120 and the first conductive film 112L, which are exposed through the opening H1, may be formed. In embodiments, the mask spacer 122 may include a silicon oxide film, as a non-limiting example.

Referring to FIG. 11F, an ion implantation process may be performed by using the capping layer 118L and the mask spacer 122 as an ion implantation mask pattern, and thus, a first impurity region 128 may be formed in the substrate 102.

Referring to FIG. 11G, the mask spacer 122 may be removed from the resultant structure of FIG. 11F. As a result, a portion of the insulating spacer 120 and a portion of the tunnel insulating film 110L, which are exposed, may be removed, and thus, the first impurity region 128 may be exposed through the opening H1.

In embodiments, the portion of the insulating spacer 120 may be removed. Thus, the silicon oxide film (refer to 120B in FIG. 11F) of the insulating spacer 120 may be removed, while only the silicon nitride film 120A of the insulating spacer 120 may remain on the substrate 102.

Referring to FIG. 11H, in the resultant structure of FIG. 11G, a second tunnel insulating film 124 may be formed to conformally cover the exposed surfaces of the memory region MR.

Referring to FIG. 11I, in the resultant structure of FIG. 11H, an erase gate line EGL may be formed to fill a partial space of the opening H1 on the second tunnel insulating film 124. In embodiments, to form the erase gate line EGL, in the resultant structure of FIG. 11H, a doped polysilicon film having a sufficient thickness as to fill the remaining space of the opening H1 may be formed on the second tunnel insulating film 124 and then etched back. During the process of etching back the doped polysilicon film, a portion of each of the second tunnel insulating film 124 and the capping layer 118L may be removed together. As a result, the erase gate line EGL may be formed. After the erase gate line EGL is formed, a thickness of each of the second tunnel insulating film 124 and the capping layer 118L in a vertical direction (Z direction) may be reduced.

Referring to FIG. 11J, in the resultant structure of FIG. 11I, a mask pattern MP2 may be formed to cover the erase gate line EGL and a portion of the capping layer 118L adjacent to the erase gate line EGL. In embodiments, the mask pattern MP2 may include a photoresist pattern.

The capping layer 118L and the second conductive film 116L may be etched by using the mask pattern MP2 as an etch mask, and thus, a control gate line CGL and a capping layer 118 covering a top surface of the control gate line CGL may be formed. In the process of etching the second conductive film 116L, an etching time and/or etching atmosphere of the second conductive film 116L may be adjusted. As a result, the control gate line CGL may include an inclined surface C1, which is inclined such that a width of the control gate line CGL in the first lateral direction (X direction) is reduced toward the substrate 102. A slope of the inclined surface C1 of the control gate line CGL may be higher than a slope of a sidewall of the capping layer 118, which is exposed around a sidewall of the mask pattern MP2. As used herein, a higher slope means that an angle from the vertical direction (Z direction) toward a lateral direction (e.g., X direction) is greater. By forming the inclined surface C1 in the control gate line CGL, an undercut region UC may be between the inclined surface C1 of the control gate line CGL and a top surface of the dielectric film 114L.

Referring to FIG. 11K, in the resultant structure of FIG. 11J, a portion of the dielectric film 114L may be removed by etching using the mask pattern MP2 as an etch mask, and a dielectric film 114 may remain under the control gate line CGL.

Referring to FIG. 11L, in the resultant structure of FIG. 11K, a portion of each of the first conductive film 112L and the tunnel insulating film 110L may be removed by etching using the mask pattern MP2 as an etch mask, and thus, a first tunnel insulating film 110 and the floating gate line FGL may remain on the active region AC of the substrate 102.

Referring to FIG. 11M, in the resultant structure of FIG. 11L, an insulating spacer 130 covering a sidewall of each of the first tunnel insulating film 110, the floating gate line FGL, the dielectric film 114, the control gate line CGL, and the capping layer 118 may be formed.

During the formation of the insulating spacer 130, the insulating spacer 130 including a protrusion 130P and a recess 130R may be formed due to the inclined surface C1 of the control gate line CGL and the undercut region UC located thereunder.

Referring to FIG. 11N, a first well W1 may be formed in the first active region A1 in the first region LA1 of the logic region LR, and a second well W2 may be formed in the second active region A2 in the second region LA2 of the logic region LR. In embodiments, the first well W1 may include a P-type impurity region, and the second well W2 may include an N-type impurity region.

Referring to FIG. 11O, a selection gate dielectric film 142 and a work-function control metal film 144 may be formed to conformally cover the resultant structure of FIG. 11N in the memory region MR. A lower work-function control metal nitride film 146L and an upper work-function control metal nitride film 146U may be formed on the work-function control metal film 144.

The selection gate dielectric film 142 and the work-function control metal film 144 may be formed by using an atomic layer deposition (ALD) process. As a result, the selection gate dielectric film 142 and the work-function control metal film 144 may be formed on the substrate 102 to continuously extend without being cut off. A portion of the work-function control metal film 144, which covers the insulating spacer 130, may have a sectional structure having a shape to which a profile of the recess 130R of the insulating spacer 130 is transferred. Accordingly, a portion of the work-function control metal film 144 that covers the recess 130R of the insulating spacer 130 may have a more recessed shape than other portions thereof.

The lower work-function control metal nitride film 146L and the upper work-function control metal nitride film 146U may be simultaneously formed by using a physical vapor deposition (PVD) process. In this case, due to deposition characteristics of the PVD process, a deposition material may not be deposited on a partial region of an exposed surface of the work-function control metal film 144, which covers the recess 130R of the insulating spacer 130. As a result, after the lower work-function control metal nitride film 146L and the upper work-function control metal nitride film 146U are formed, a portion of the work-function control metal film 144 may be exposed between the lower work-function control metal nitride film 146L and the upper work-function control metal nitride film 146U.

A first gate dielectric film 142A, a first work-function control metal film 144A, and a first work-function control metal nitride film 146A may be sequentially formed on the substrate 102 in the first region LA1 of the logic region LR, and a second gate dielectric film 142B, a second work-function control metal film 144B, and a second work-function control metal nitride film 146B may be sequentially formed on the substrate 102 in the second region LA2 of the logic region LR.

The first gate dielectric film 142A located in the first region LA1 of the logic region LR and the second gate dielectric film 142B located in the second region LA2 of the logic region LR may be formed simultaneously with the selection gate dielectric film 142 located in the memory region MR.

The first work-function control metal film 144A located in the first region LA1 of the logic region LR and some components of the second work-function control metal film 144B located in the second region LA2 of the logic region LR may be formed simultaneously with the work-function control metal film 144 located in the memory region MR.

The first work-function control metal nitride film 146A located in the first region LA1 of the logic region LR and the second work-function control metal nitride film 146B located in the second region LA2 of the logic region LR may be formed simultaneously with the lower work-function control metal nitride film 146L and the upper work-function control metal nitride film 146U, which are located in the memory region MR.

Referring to FIG. 11P, a gate-forming conductive film may be formed on the resultant structure of FIG. 11O in the memory region MR and the logic region LR. In embodiments, the gate-forming conductive film may include doped polysilicon.

Thereafter, a photolithography process may be performed. Thus, a first etching process of etching the selection gate dielectric film 142, the work-function control metal film 144, the lower work-function control metal nitride film 146L, the upper work-function control metal nitride film 146U, and the gate-forming conductive film, which are in the memory region MR, may be performed to form a pair of selection gate structures SGS, which have a mutually symmetrical shape. The pair of selection gate structures SGS may each have a first sidewall S1 and a second sidewall S2. The first sidewall S1 may vertically overlap the memory transistor MTR above the memory transistor MTR. The second sidewall S2 may be apart from the insulating spacer 130 in the first lateral direction (X direction) and closer to the substrate 102 than is the first sidewall S1.

During the photolithography process, a second etching process for etching the first gate dielectric film 142A, the first work-function control metal film 144A, the first work-function control metal nitride film 146A, and the gate-forming conductive film, which are in the first region LA1 of the logic region LR, may be performed to form a first gate G1. A portion of each of the first gate dielectric film 142A, the first work-function control metal film 144A, and the first work-function control metal nitride film 146A may remain between the first active region A1 of the substrate 102 and the first gate G1.

During the photolithography process, a third etching process for etching the second gate dielectric film 142B, the second work-function control metal film 144B, the second work-function control metal nitride film 146B, and the gate-forming conductive film, which are in the second region LA2 of the logic region LR, may be performed to form a second gate G2, and a portion of each of the second gate dielectric film 142B, the second work-function control metal film 144B, and the second work-function control metal nitride film 146B may remain between the second active region A2 of the substrate 102 and the second gate G2.

The first etching process, the second etching process, and the third etching process may be performed simultaneously. After the first etching process, the second etching process, and the third etching process are performed, a strip process may be performed while the first sidewall S1 and the second sidewall S2 of the selection gate structure SGS are exposed. In embodiments, the strip process may be performed by using phosphoric acid ($H_3PO_4$). During the strip process of the selection gate structure SGS in the resultant structure of FIG. 11P, there is a possibility that the upper work-function control metal nitride film 146U, which is exposed at the second sidewall S2 close to an uppermost surface of the substrate 102, could be damaged or consumed due to phosphoric acid. However, even in this case, the lower work-function control metal nitride film 146L of a selection transistor STR, which affects the performance of the selection transistor STR, is unlikely to be exposed to phosphoric acid since the lower work-function control metal nitride film 146L is spaced apart from the upper work-function control metal nitride film 146U. Accordingly, the lower work-function control metal nitride film 146L be protected from damage or consumption due to phosphoric acid.

Referring to FIG. 11Q, a plurality of insulating spacers 152 may be formed in the memory region MR and the logic region LR of the resultant structure of FIG. 11P. A plurality of second impurity regions 180 may be formed in the memory region MR, and a pair of first source/drain regions 160A and a pair of second source/drain regions 160B may be formed in the logic region LR.

Thereafter, as shown in FIGS. 2B, 2C, and 3, an interlayer insulating film 190 may be formed to cover the resultant structure of FIG. 11Q. In the memory region MR, a plurality of bit line contacts 180C may be formed to pass through the interlayer insulating film 190 and connected to the second impurity region 180. Thus, the IC device 100 may be manufactured.

Although the method of manufacturing the IC device 100 shown in FIGS. 2A to 2C and 3 has been described with reference to FIGS. 11A to 11Q, it is to be understood that the IC devices 200, 300, and 400 described with reference to FIGS. 8, 9, and 10, and IC devices having variously changed structures, may be manufactured by applying various modifications and changes to the processes described with reference to FIGS. 11A to 11Q within the scope of the embodiments.

For example, to manufacture the IC device 200 shown in FIG. 8, an etching time and/or an etching atmosphere may be adjusted in the process of forming the dielectric film 114 described with reference to FIG. 11K and the process of forming the first tunnel insulating film 110 and the floating gate line FGL described with reference to FIG. 11L. Thus, a floating gate line FGL2 including a second inclined surface F1 may be formed. The processes described with reference to FIGS. 11M to 11Q may be performed on the resultant structure, and thus, the IC device 200 shown in FIG. 8 may be manufactured.

To manufacture the IC device 300 shown in FIG. 9, after the first etching process, the second etching process, and the third etching process, which are described with reference to FIG. 11P, are performed, the upper work-function control metal nitride film 146U may be removed through the second sidewall S2 of the selection gate structure SGS, which is exposed, thereby forming an air gap AG3. Subsequently, the processes described with reference to FIG. 11Q may be performed, and thus, the IC device 300 shown in FIG. 9 may be manufactured.

To manufacture the IC device 400 shown in FIG. 10, processes similar to those of the method of manufacturing the IC device 300 shown in FIG. 9 may be performed.

Accordingly, an integrated circuit (IC) device is provided that has a structure capable of improving the reliability of a selection transistor in a logic embedded flash memory device including a split gate-type transistor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
a floating gate line and a control gate line overlapping each other in a vertical direction on a substrate;
an insulating spacer covering a sidewall of each of the floating gate line and the control gate line; and
a selection gate structure apart from the floating gate line and the control gate line in a first lateral direction with the insulating spacer therebetween, the selection gate structure having a first sidewall and a second sidewall, the first sidewall vertically overlapping the control gate line above the control gate line, the second sidewall being apart from the insulating spacer in the first lateral direction, the second sidewall being closer to the substrate than the first sidewall,
wherein the selection gate structure includes:
a selection gate line apart from the insulating spacer, the selection gate line continuously extending from the first sidewall to the second sidewall; and
a lower metal nitride film between the substrate and a bottom surface of the selection gate line and between a sidewall of the selection gate line and the insulating spacer, the lower metal nitride film having a first uppermost surface closer to the substrate than an uppermost surface of the insulating spacer.

2. The integrated circuit device as claimed in claim 1, wherein:
the sidewall of the control gate line, facing the insulating spacer, includes an inclined surface that is inclined such that a width of the control gate line in the first lateral direction is reduced toward the substrate,
the insulating spacer includes a protrusion facing the inclined surface; and a recess facing the selection gate line on an opposite side of the protrusion, the protrusion being convex toward the control gate line, and the recess being concave toward the selection gate line, and
a vertical level of the first uppermost surface of the lower metal nitride film is lower than or equal to a vertical level of the recess of the insulating spacer.

3. The integrated circuit device as claimed in claim 1, wherein:

the selection gate structure further includes an upper metal nitride film between the selection gate line and the insulating spacer, the upper metal nitride film is apart from the lower metal nitride film in the vertical direction, and the lower metal nitride film and the upper metal nitride film include the same material as each other.

4. The integrated circuit device as claimed in claim 1, wherein:

the selection gate structure further includes an upper metal nitride film between the selection gate line and the insulating spacer, and the selection gate line includes a portion between the lower metal nitride film and the upper metal nitride film.

5. The integrated circuit device as claimed in claim 1, wherein:

the selection gate structure further includes:

an upper metal nitride film between the selection gate line and the insulating spacer; and a selection gate dielectric film continuously extending from the first sidewall of the selection gate structure to the second sidewall of the selection gate structure, to be between the lower metal nitride film and the substrate, between the selection gate line and the insulating spacer, and between the upper metal nitride film and the insulating spacer, and the selection gate line includes a gate protrusion passing between the lower metal nitride film and the upper metal nitride film in the first lateral direction, the gate protrusion protruding toward the selection gate dielectric film.

6. The integrated circuit device as claimed in claim 1, wherein the selection gate structure further includes:

a selection gate dielectric film between the lower metal nitride film and the substrate, the selection gate dielectric film continuously extending from the first sidewall of the selection gate structure to the second sidewall of the selection gate structure; and a work-function control metal film between the lower metal nitride film and the selection gate dielectric film, the work-function control metal film continuously extending from the first sidewall of the selection gate structure to the second sidewall of the selection gate structure.

7. The integrated circuit device as claimed in claim 1, wherein:

the sidewall of the control gate line, facing the insulating spacer, includes a first inclined surface, the first inclined surface being inclined such that a width of the control gate line in the first lateral direction is reduced toward the substrate, the sidewall of the floating gate line, facing the insulating spacer, includes a second inclined surface, the second inclined surface being inclined such that a width of the floating gate line in the first lateral direction increases toward the substrate, and the insulating spacer includes a protrusion facing the first inclined surface and the second inclined surface; and a recess facing the selection gate line on an opposite side of the protrusion, the protrusion having a protruding shape toward the control gate line and the floating gate line, and the recess having a concave shape toward the selection gate line, and a vertical level of the first uppermost surface of the lower metal nitride film is lower than or equal to a vertical level of the recess of the insulating spacer.

8. The integrated circuit device as claimed in claim 1, wherein:

the selection gate structure further includes an air gap between the selection gate line and the insulating spacer, and the air gap is apart from the lower metal nitride film in the vertical direction.

9. The integrated circuit device as claimed in claim 1, further comprising a dielectric film between the floating gate line and the control gate line, wherein a top surface of the dielectric film is in contact with a bottom surface of the control gate line and protrudes more toward the selection gate line than does the bottom surface of the control gate line.

10. The integrated circuit device as claimed in claim 1, further comprising:

an erase gate line apart from the selection gate line in the first lateral direction with the floating gate line and the control gate line therebetween;

a first impurity region overlapping the erase gate line in the vertical direction in the substrate; and a second impurity region adjacent to the first sidewall of the selection gate structure in the substrate.

11. An integrated circuit device, comprising:

a substrate including a memory region and a logic region;

a memory transistor on the substrate in the memory region, the memory transistor including a floating gate line and a control gate line, the floating gate line and the control gate line overlapping each other in a vertical direction;

an insulating spacer covering a sidewall of each of the floating gate line and the control gate line, in the memory region;

a selection gate structure apart from the memory transistor in a first lateral direction with the insulating spacer therebetween in the memory region, the selection gate structure having a first sidewall and a second sidewall, the first sidewall vertically overlapping the memory transistor above the memory transistor, the second sidewall being apart from the insulating spacer in the first lateral direction, the second sidewall being closer to the substrate than is the first sidewall; and a logic transistor on the substrate in the logic region, wherein:

the selection gate structure includes:

a selection gate line spaced apart from the insulating spacer, the selection gate line continuously extending from the first sidewall of the selection gate structure to the second sidewall of the selection gate structure; and a first lower work-function control film between the substrate and a bottom surface of the selection gate line and between a sidewall of the selection gate line and the insulating spacer, the first lower work-function control film having a first uppermost surface that is closer to the substrate than is an uppermost surface of the insulating spacer, the logic transistor includes:

a gate; and a second work-function control film between the substrate and the gate, and the first lower work-function control film and the second work-function control film include the same metal nitride as each other.

12. The integrated circuit device as claimed in claim 11, wherein:

the sidewall of the control gate line, facing the insulating spacer, includes an inclined surface, the inclined surface being inclined such that a width of the control gate line in the first lateral direction is reduced toward the substrate, the insulating spacer includes: a protrusion facing the inclined surface; and a recess facing the selection gate line on an opposite side of the protrusion, and a vertical level of the first uppermost surface of the first lower work-function control film is lower than or equal to a vertical level of the recess of the insulating spacer.

13. The integrated circuit device as claimed in claim 11, wherein:

the selection gate structure further includes a first upper work-function control film between the selection gate line and the insulating spacer, the first upper work-function control film including the same material as a material included in the first lower work-function control film, the first upper work-function control film is apart from the first lower work-function control film in the vertical direction, and the selection gate line is between the first uppermost surface of the first lower work-function control film and a lowermost surface of the first upper work-function control film.

14. The integrated circuit device as claimed in claim 11, wherein the selection gate structure further includes:

a selection gate dielectric film between the first lower work-function control film and the substrate and between the selection gate line and the insulating spacer, the selection gate dielectric film continuously extending from the first sidewall of the selection gate structure to the second sidewall of the selection gate structure; and a work-function control metal film between the selection gate dielectric film and the first lower work-function control film, the work-function control metal film continuously extending from the first sidewall of the selection gate structure to the second sidewall of the selection gate structure.

15. The integrated circuit device as claimed in claim 11, wherein:

the sidewall of the control gate line, facing the insulating spacer, includes a first inclined surface, the first inclined surface being inclined such that a width of the control gate line in the first lateral direction is reduced toward the substrate, the sidewall of the floating gate line, facing the insulating spacer, includes a second inclined surface, the second inclined surface being inclined such that a width of the floating gate line in the first lateral direction increases toward the substrate, and the insulating spacer includes a protrusion facing the first inclined surface and the second inclined surface; and a recess facing the selection gate line on an opposite side of the protrusion, and a vertical level of the first uppermost surface of the first lower work-function control film is lower than or equal to a vertical level of the recess of the insulating spacer.

16. The integrated circuit device as claimed in claim 11, wherein:

the selection gate structure further includes an air gap between the selection gate line and the insulating spacer, and the air gap is spaced apart from the first lower work-function control film in the vertical direction.

17. The integrated circuit device as claimed in claim 11, further comprising a dielectric film between the floating gate line and the control gate line, wherein a top surface of the dielectric film is in contact with a bottom surface of the control gate line, and the top surface of the dielectric film protrudes more toward the selection gate line than does the bottom surface of the control gate line.

18. The integrated circuit device as claimed in claim 11, further comprising:

an erase gate line spaced apart from the selection gate line in the first lateral direction with the floating gate line and the control gate line therebetween in the memory region;

a source line in the substrate in the memory region, the source line overlapping the erase gate line in the vertical direction; and a bit line in the substrate in the memory region, the bit line being adjacent to the first sidewall of the selection gate structure.

19. An integrated circuit device, comprising:

a memory transistor including a floating gate line and a control gate line, the floating gate line and the control gate line overlapping each other in a vertical direction on a substrate;

an insulating spacer covering a sidewall of each of the floating gate line and the control gate line; and a selection gate structure apart from the floating gate line and the control gate line in a first lateral direction with the insulating spacer therebetween, the selection gate structure having a first sidewall and a second sidewall, the first sidewall vertically overlapping the control gate line above the control gate line, the second sidewall being apart from the insulating spacer in the first lateral direction, the second sidewall being closer to the substrate than is the first sidewall, wherein:

the selection gate structure includes an interface insulating film, a high-k dielectric film, a work-function control metal film, a lower work-function control metal nitride film, and a selection gate line, which are sequentially stacked on the substrate, each of the high-k dielectric film, the work-function control metal film, and the selection gate line continuously extends from the first sidewall of the selection gate structure to the second sidewall of the selection gate structure, and the lower work-function control metal nitride film includes a first portion and a second portion, the first portion being between the work-function control metal film and a bottom surface of the selection gate line at a position apart from the insulating spacer in the first lateral direction, and the second portion being between the work-function control metal film and the sidewall of the selection gate line at a position closer to the insulating spacer than the first portion, wherein a first uppermost surface of the lower work-function control metal nitride film is closer to the substrate than is an uppermost surface of the insulating spacer.

20. The integrated circuit device as claimed in claim 19, wherein:

the selection gate line includes a gate protrusion covering the first uppermost surface of the lower work-function control metal nitride film, the insulating spacer includes a recess facing the gate protrusion, the recess being concave toward the selection gate line, and

a vertical level of the first uppermost surface of the lower
work-function control metal nitride film is lower than
or equal to a vertical level of the recess of the insulating
spacer.

* * * * *